United States Patent
Young et al.

(10) Patent No.: US 12,302,557 B2
(45) Date of Patent: May 13, 2025

(54) THREE-DIMENSIONAL MEMORY DEVICE AND METHOD OF MANUFACTURE

(71) Applicant: Taiwan Semiconductor Manufacturing Co., Ltd., Hsinchu (TW)

(72) Inventors: Bo-Feng Young, Taipei (TW); Sai-Hooi Yeong, Zhubei (TW); Chi On Chui, Hsinchu (TW); Chun-Chieh Lu, Taipei (TW); Yu-Ming Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/362,092

(22) Filed: Jul. 31, 2023

(65) Prior Publication Data
US 2023/0413544 A1     Dec. 21, 2023

Related U.S. Application Data

(62) Division of application No. 17/076,505, filed on Oct. 21, 2020, now Pat. No. 11,765,892.

(51) Int. Cl.
| | |
|---|---|
| *G11C 7/18* | (2006.01) |
| *G11C 8/14* | (2006.01) |
| *H10B 41/10* | (2023.01) |
| *H10B 41/27* | (2023.01) |
| *H10B 43/10* | (2023.01) |
| *H10B 43/27* | (2023.01) |

(52) U.S. Cl.
CPC ............ *H10B 41/27* (2023.02); *G11C 7/18* (2013.01); *G11C 8/14* (2013.01); *H10B 41/10* (2023.02); *H10B 43/10* (2023.02); *H10B 43/27* (2023.02)

(58) Field of Classification Search
CPC ........ H10B 41/10; H10B 41/20; H10B 43/10; H10B 43/30
See application file for complete search history.

(56) References Cited

U.S. PATENT DOCUMENTS

| | | | |
|---|---|---|---|
| 5,808,943 A | * | 9/1998 | Sato .................. H10B 99/00 257/E27.084 |
| 9,076,722 B2 | | 7/2015 | Sakuma et al. |
| 9,209,247 B2 | | 12/2015 | Colinge et al. |
| 9,236,267 B2 | | 1/2016 | De et al. |
| 9,412,817 B2 | | 8/2016 | Yang et al. |

(Continued)

*Primary Examiner* — Vincent Wall
(74) *Attorney, Agent, or Firm* — Slater Matsil, LLP

(57) ABSTRACT

In an embodiment, a method includes forming a multi-layer stack including alternating layers of an isolation material and a semiconductor material, patterning the multi-layer stack to form a first channel structure in a first region of the multi-layer stack, where the first channel structure includes the semiconductor material, depositing a memory film layer over the first channel structure, etching a first trench extending through a second region of the multi-layer stack to form a first dummy bit line and a first dummy source line in the second region, where the first dummy bit line and first dummy source line each include the semiconductor material, and replacing the semiconductor material of the first dummy bit line and the first dummy source line with a conductive material to form a first bit line and a first source line.

20 Claims, 30 Drawing Sheets

(56) References Cited

U.S. PATENT DOCUMENTS

| | | |
|---|---|---|
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,833,101 B2 | 11/2020 | Shimomura et al. |
| 10,847,540 B2 * | 11/2020 | Or-Bach ........... H01L 21/31116 |
| 2010/0226195 A1 | 9/2010 | Lue |
| 2011/0266604 A1 | 11/2011 | Kim et al. |
| 2012/0007167 A1 | 1/2012 | Hung et al. |
| 2014/0273372 A1 | 9/2014 | Sakuma |
| 2017/0117291 A1 * | 4/2017 | Or-Bach ................ H10B 43/27 |
| 2020/0111793 A1 | 4/2020 | Kim et al. |
| 2020/0185411 A1 * | 6/2020 | Herner .............. H01L 21/32139 |
| 2020/0402984 A1 | 12/2020 | Reznicek et al. |
| 2021/0036019 A1 | 2/2021 | Sharangpani et al. |
| 2021/0036020 A1 | 2/2021 | Park et al. |
| 2021/0398989 A1 | 12/2021 | Lin et al. |
| 2021/0408022 A1 | 12/2021 | Young et al. |
| 2022/0013532 A1 | 1/2022 | Young et al. |
| 2022/0028893 A1 | 1/2022 | Lin et al. |
| 2022/0037253 A1 | 2/2022 | Yang et al. |
| 2022/0123003 A1 | 4/2022 | Young et al. |
| 2022/0130856 A1 | 4/2022 | Kim et al. |
| 2022/0140104 A1 | 5/2022 | Heo et al. |

* cited by examiner

THREE-DIMENSIONAL MEMORY DEVICE AND METHOD OF MANUFACTURE

CROSS-REFERENCE TO RELATED APPLICATIONS

This application is a divisional of U.S. application Ser. No. 17/076,505, filed on Oct. 21, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
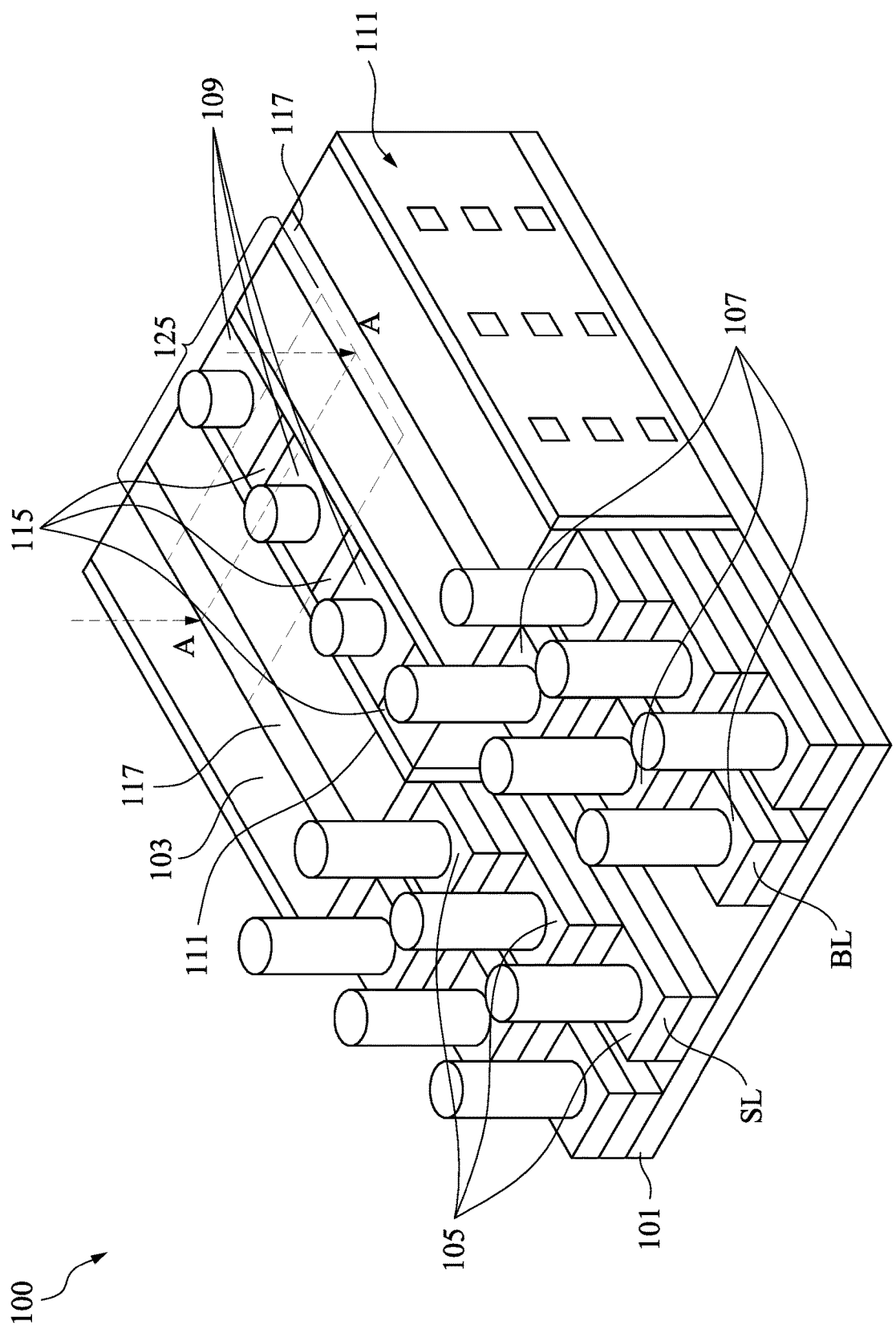
FIG. 1A illustrates a 3D NOR memory array, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a 3-dimensional (3D) memory array (e.g., a NOR memory array) is described that includes a plurality of stacked memory cells, where each of the memory cells may include a gate all around (GAA) transistor. Various embodiments include forming a metal-free multi-layer stack comprising dummy source lines and dummy bit lines. The dummy source lines and dummy bit lines are subsequently replaced by a conductive material to form source lines and bit lines. The use of dummy source lines and dummy bit lines may provide some advantages. Embodiments of the present disclosure may include the use of the metal-free multi-layer stack that simplifies a subsequent etching process used to pattern a gate structure and allows for a better etching profile than would have been possible if the multi-layer structure comprised one or more metal layers. In addition, the source line and the bit line are formed in the same layer which allows for a reduction in the height and the aspect ratio of the metal-free multi-layer stack that is used in the fabrication process. The resulting memory array may also have a reduced height, increasing device density. Further, embodiments of the present disclosure allow for a source line of a first memory cell and a bit line of an adjacent second memory cell that are formed in the same layer to be isolated from each other such that there is minimal interference between the first memory cell and the second memory when read and/or write operations are being performed in the first memory cell and the second memory cell.

Figure 1B:
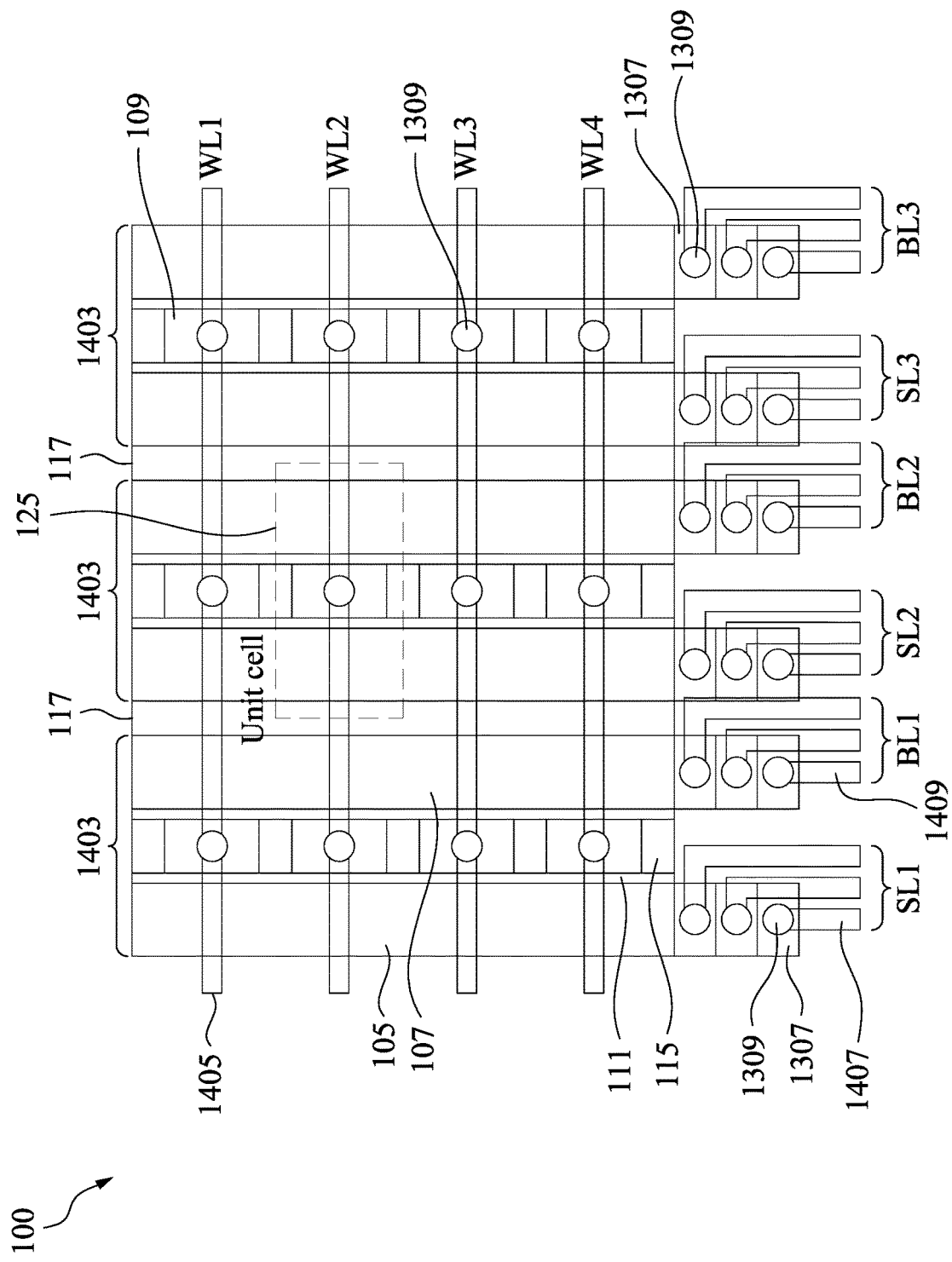
FIG. 1B illustrates a top-down view of the 3D NOR memory array, in accordance with an embodiment.
Figure 1C:
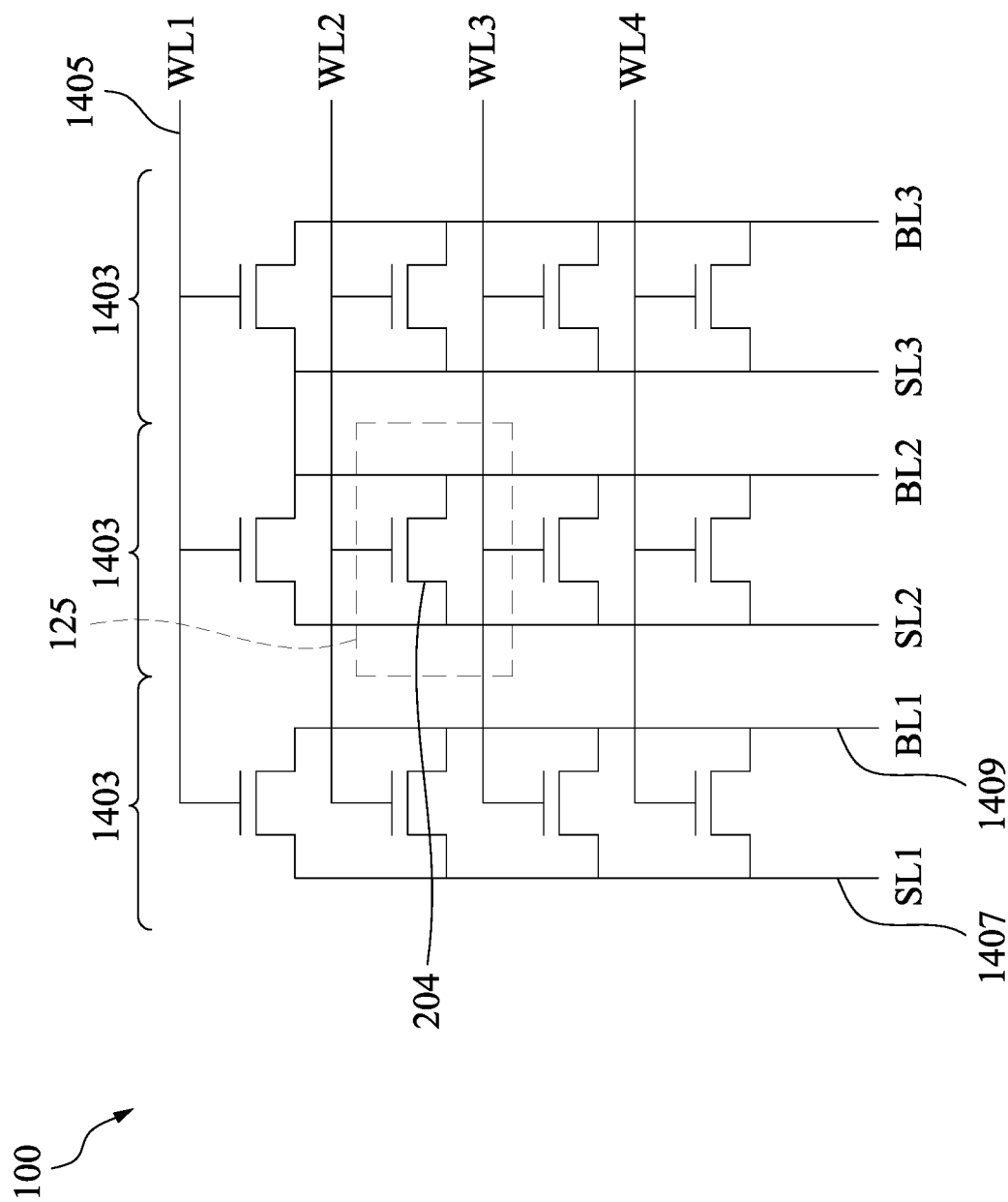
FIG. 1C illustrates an equivalent circuit of the 3D NOR memory array, in accordance with an embodiment.
Figure 12A:
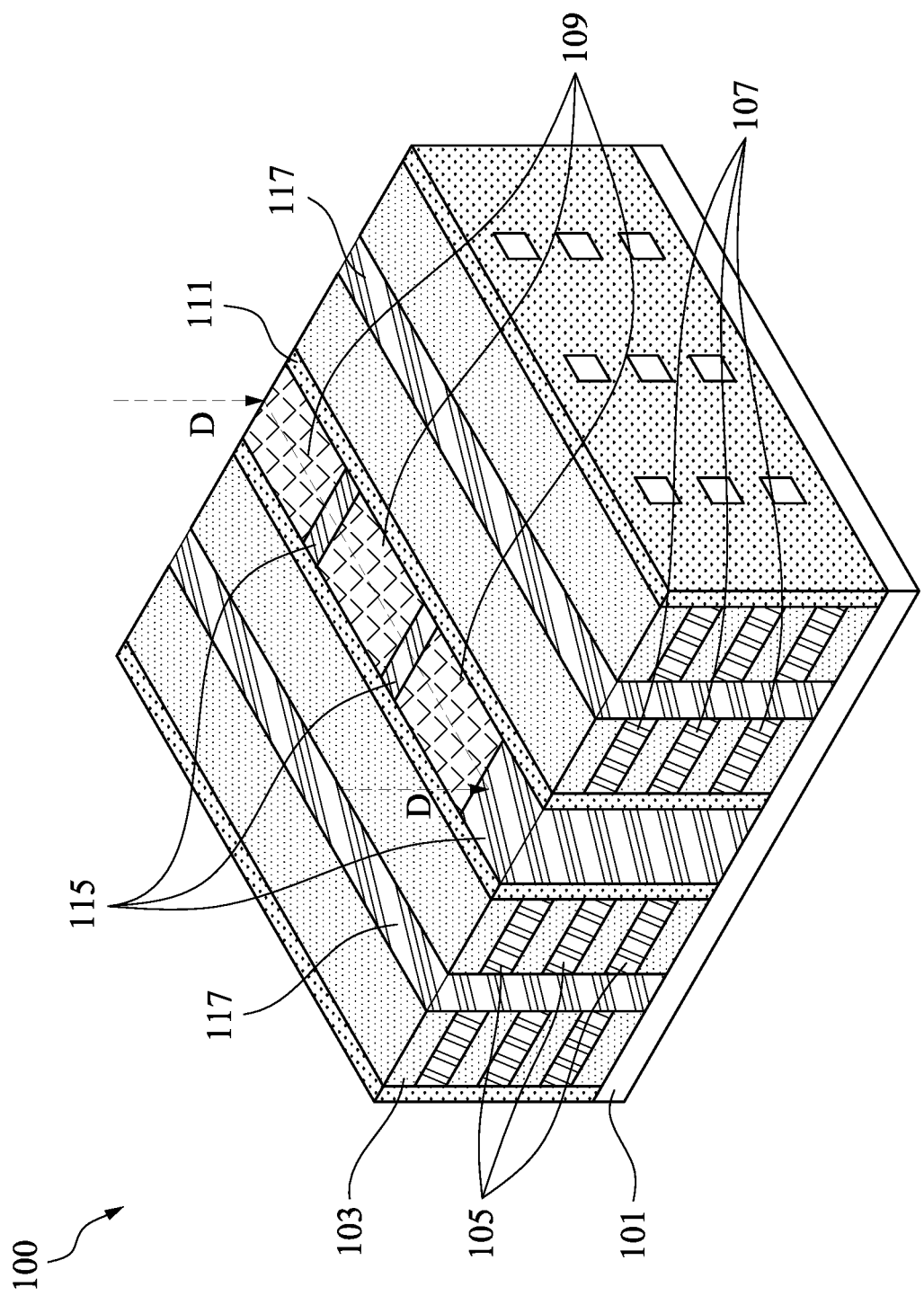
Figure 12D:
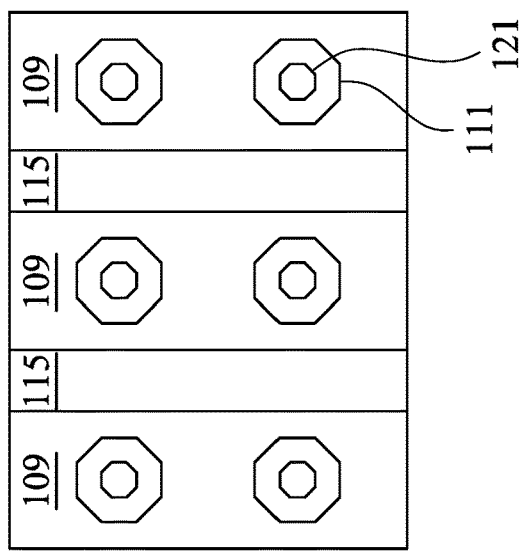
Figure 12C:
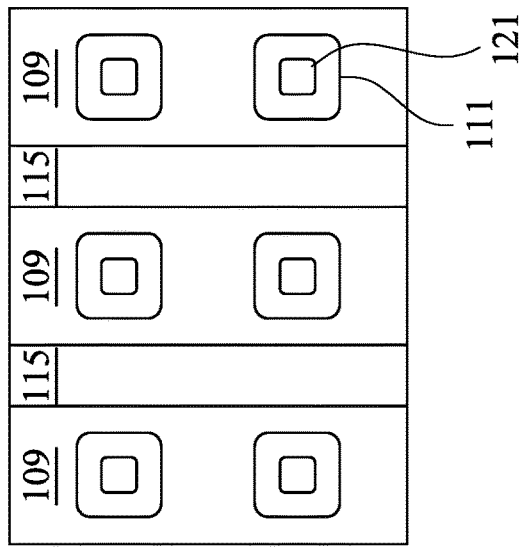
Figure 12B:
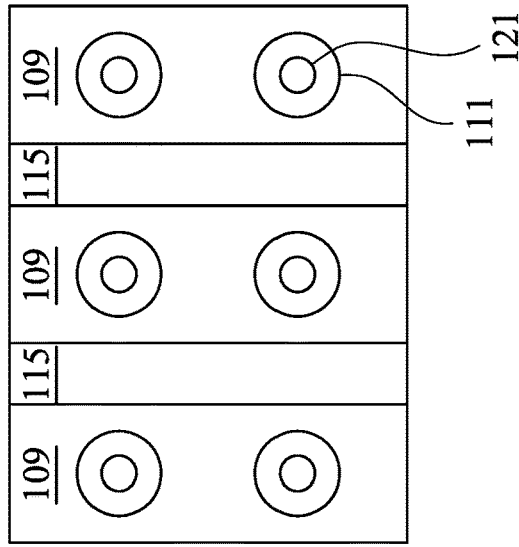
Figure 12F:
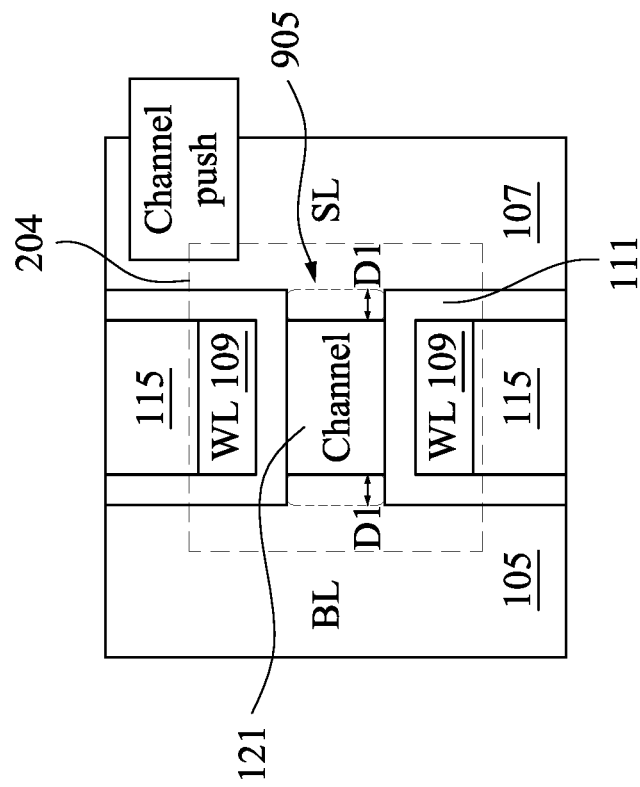
Figure 12E:
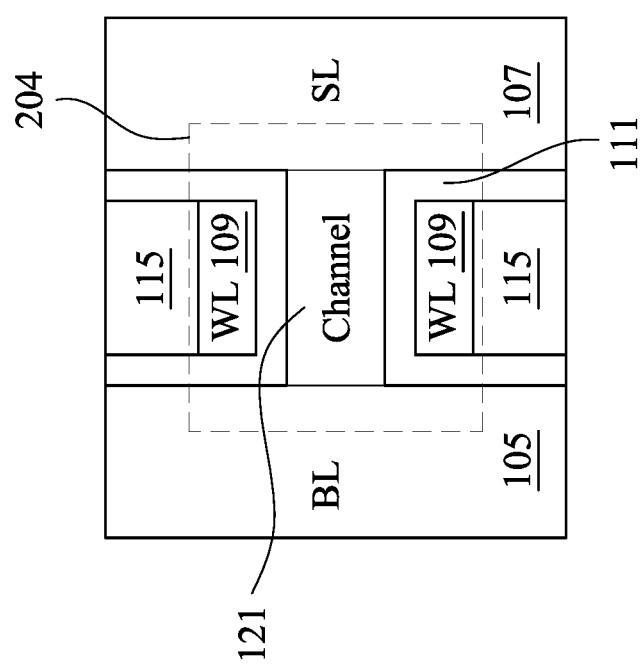
Figure 13A:
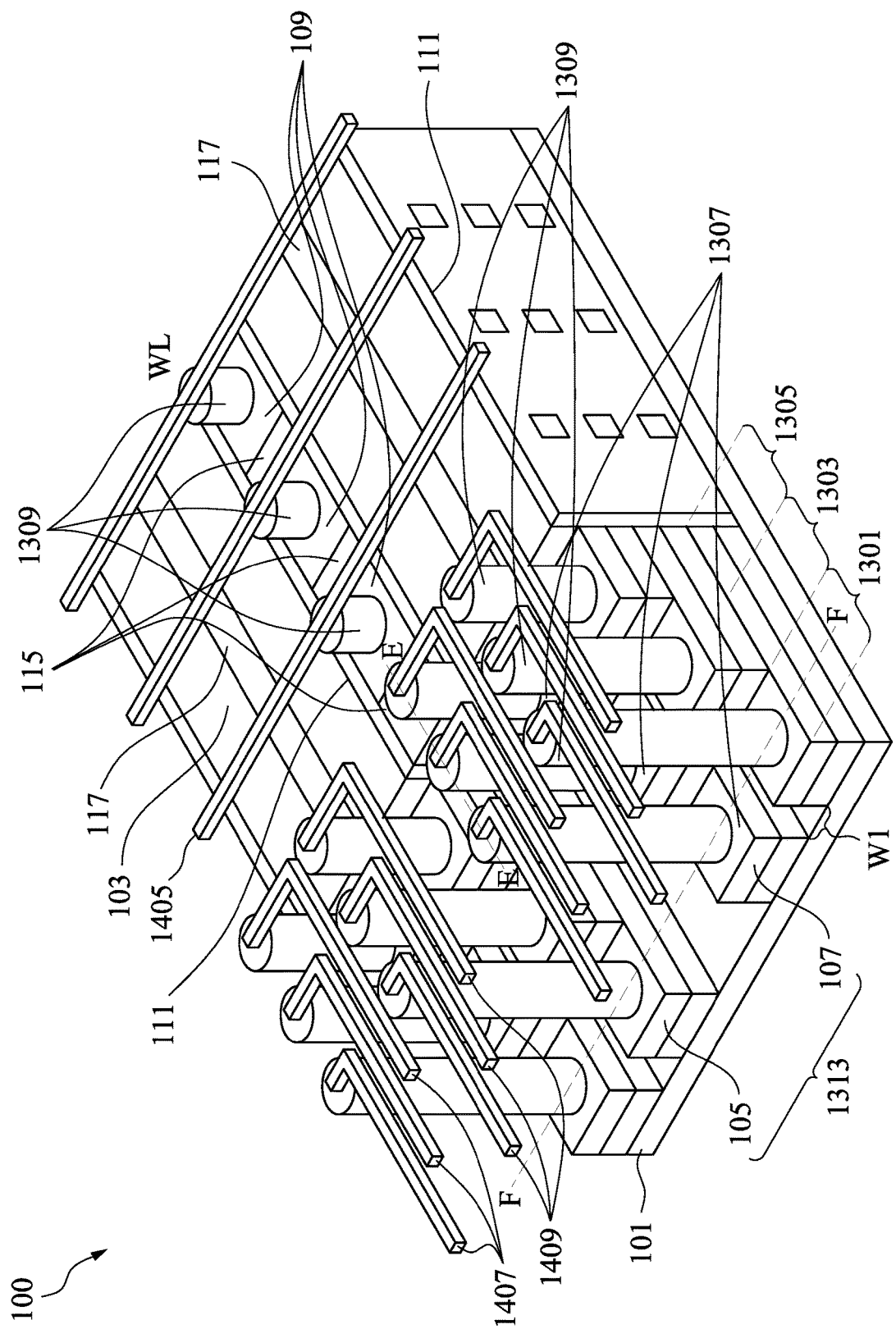
Figure 13B:
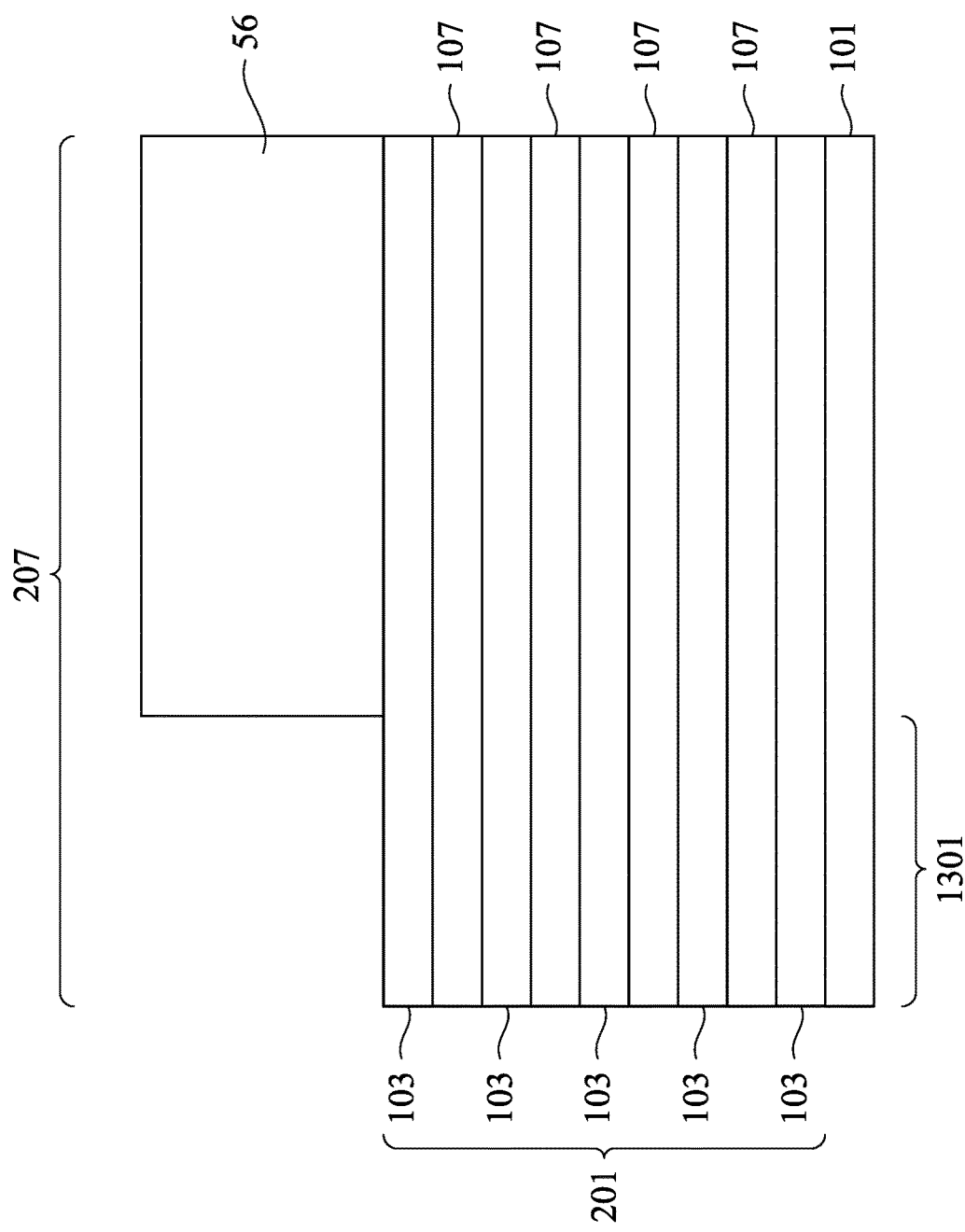
Figure 13C:
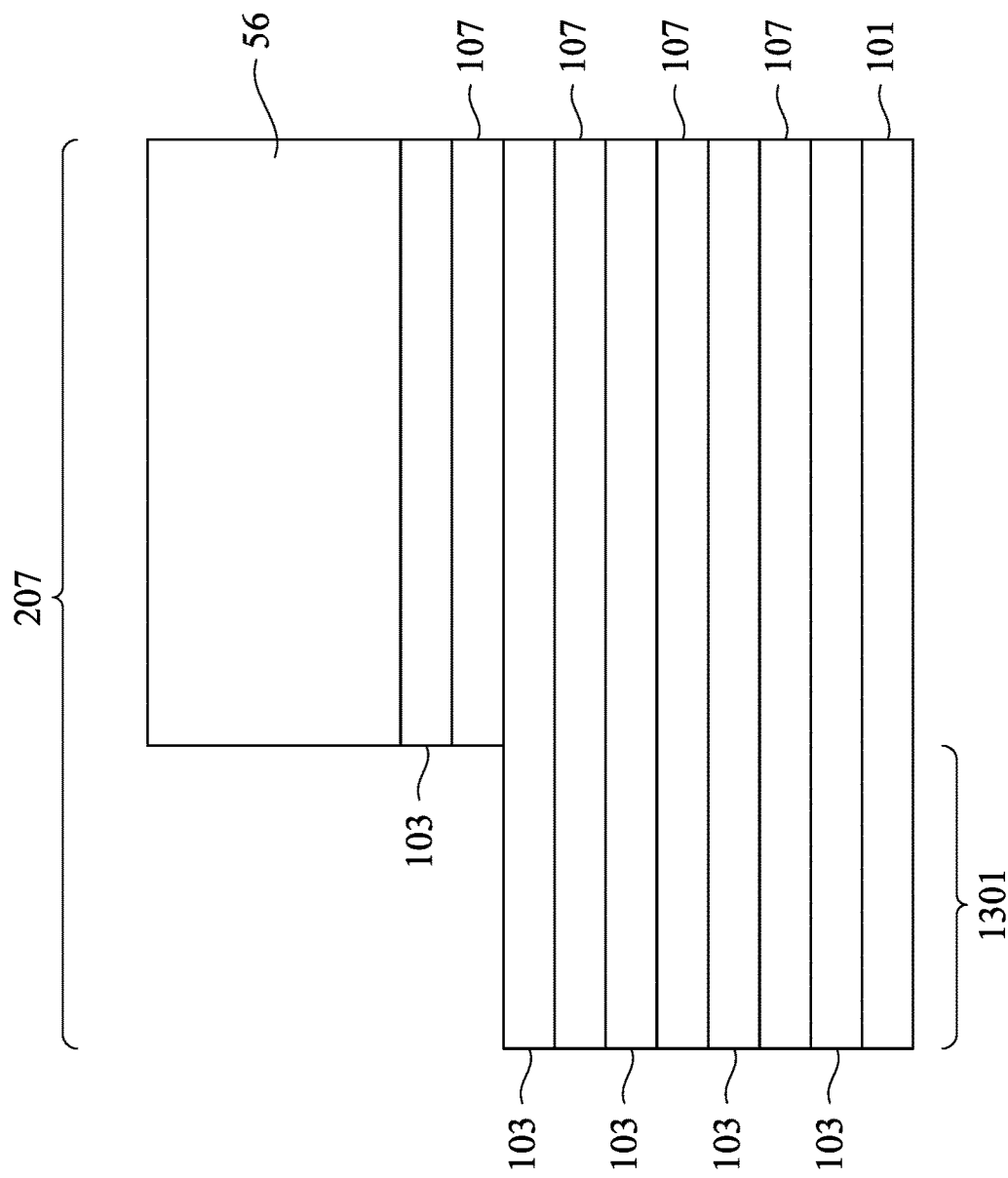
Figure 13D:
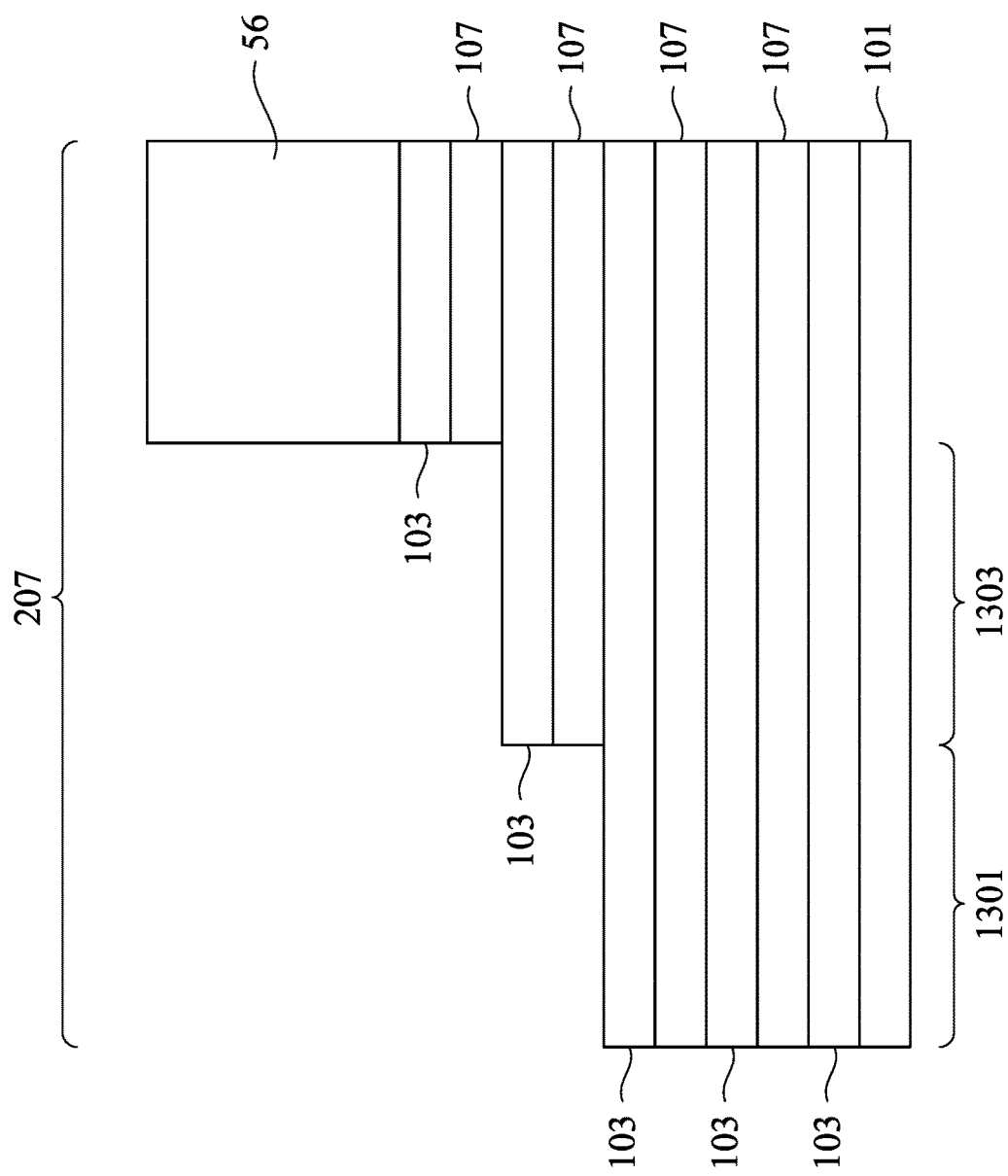
Figure 13E:
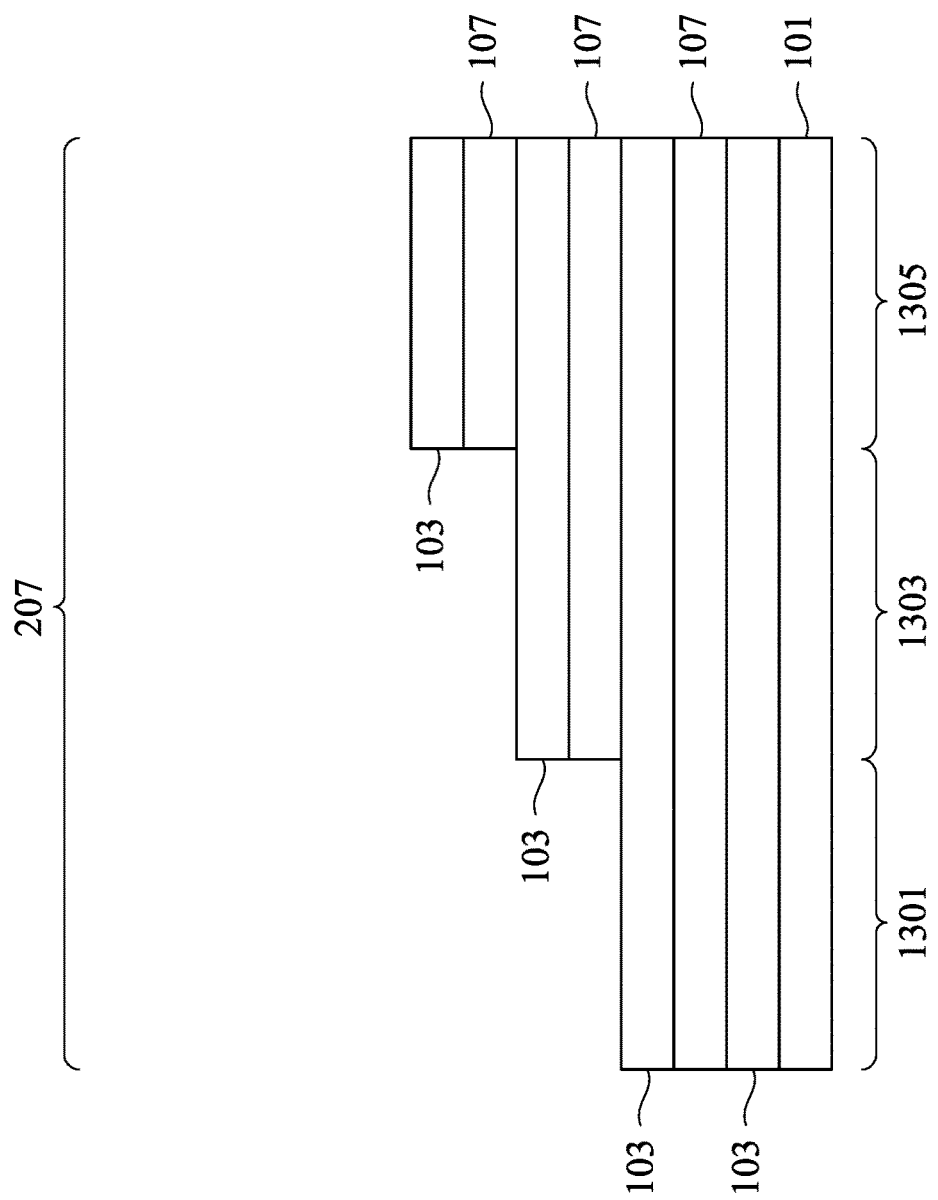
Figure 13F:
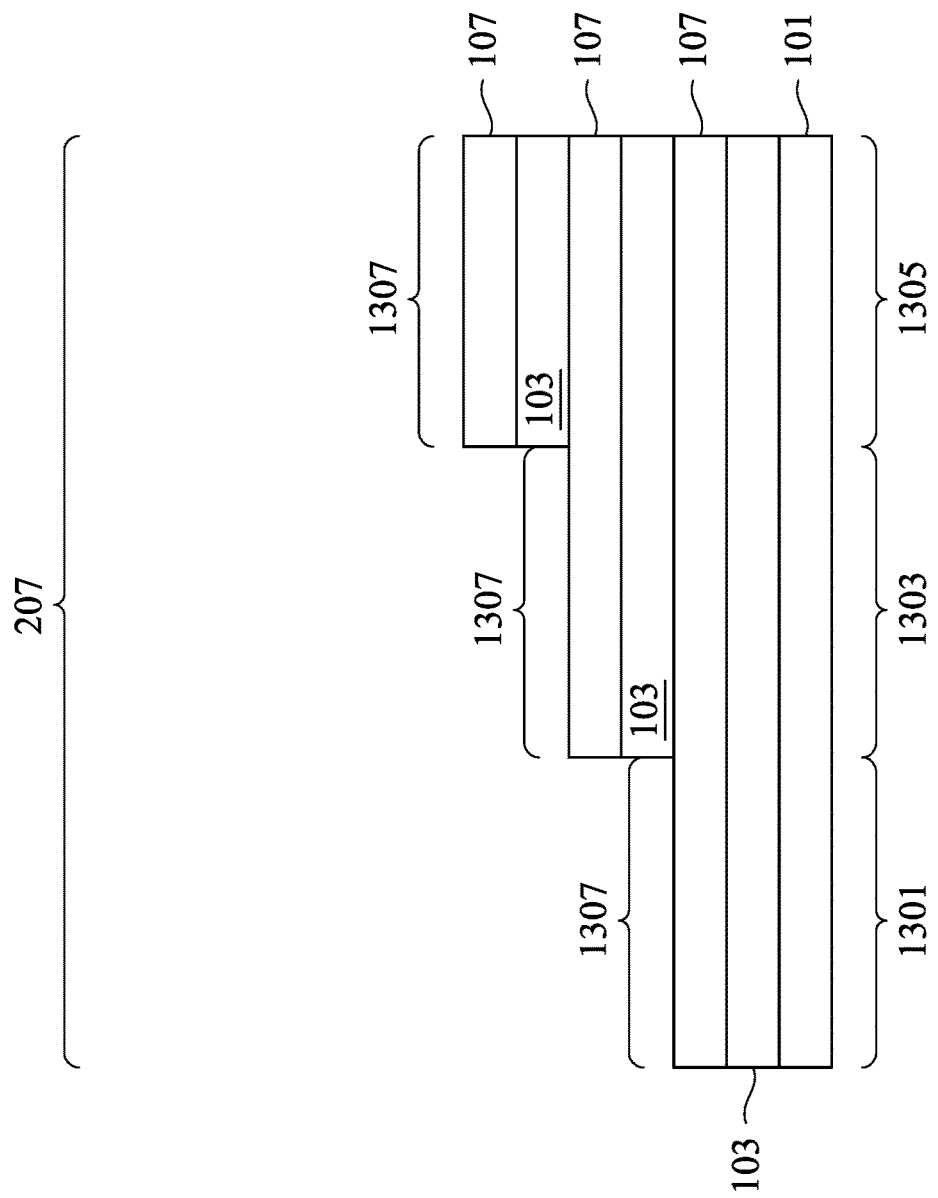

FIGS. 1A and 13A illustrate perspective views of the memory array 100, in accordance with embodiments. FIGS. 1D, 1E, 1F, and 1G illustrate perspective, cross-sectional and top-views of the memory array 100, in accordance with an embodiment. FIGS. 2, 3A, 3B, 4, 5, 6, 7, 8, 9A, 9B, 9C, 9D, 9E, 10, 11, 12A, 12B, 12C, 12D, 12E, 12F, 13B, 13C, 13D, 13E, 13F, and 13G illustrate perspective, cross-sectional and top-views of intermediate stages in the manufacture of a memory array 100, in accordance with embodiments. FIG. 1B illustrates a top-down view of the memory array 100, in accordance with an embodiment. FIG. 1C illustrates an equivalent circuit of the memory array 100, in accordance with an embodiment.

FIGS. 1A through 1G illustrate examples of a memory array according to some embodiments. FIG. 1A illustrates a portion of the memory array 100 in a three-dimensional view, in accordance with some embodiments, and FIG. 1B illustrates a top-down view of the memory array 100. The memory array 100 includes a plurality of memory cells 125, which may be arranged in a grid of rows and columns. The memory cells 125 may further stacked vertically to provide a three dimensional memory array, thereby increasing device density. The memory array 100 may be disposed in the back end of line (BEOL) of a semiconductor die. For example, the memory array may be disposed in the interconnect layers of the semiconductor die, such as, above one or more active devices (e.g., transistors) formed on a semiconductor substrate.

In some embodiments, the memory array 100 is a flash memory array, such as a NOR flash memory array, or the like. Each memory cell 125 (see FIGS. 1A through 1D) may include a transistor 204 (see FIG. 1D, which is a cross-sectional view of the cut-line A-A of FIG. 1A). The 3D memory array 100 includes a plurality of vertically stacked source lines 105 adjacent to a plurality of vertically stacked bit lines 107. Each source line 105 and its corresponding bit line 107 are disposed in a same layer, with isolation layer 103 disposed between adjacent ones of the plurality of vertically stacked source lines 105 and between adjacent ones of the plurality of vertically stacked bit lines 107. The source lines 105 and the bit lines 107 extend in a direction parallel to a major surface of an underlying substrate 101. The source lines 105 and the bit lines 107 may have a staircase configuration such that lower source lines 105 are longer than and extend laterally past endpoints of upper source lines 105, and lower bit lines 107 are longer than and extend laterally past endpoints of upper bit lines 107. For example, in FIG. 1A, multiple, stacked layers of source lines 105 are illustrated with topmost source lines 105 being the shortest and bottommost source lines 105 being the longest. In addition, multiple, stacked layers of bit lines 107 are illustrated with topmost bit lines 107 being the shortest and bottommost bit lines 107 being the longest. Respective lengths of the source lines 105 and the bit lines 107 may increase in a direction towards the underlying substrate 101. In this manner, a portion of each of the source lines 105 and the bit lines 107 may be accessible from above the memory array 100, and conductive contacts may be made to an exposed portion of each of the source lines 105 and the bit lines 107.

Figure 1D:
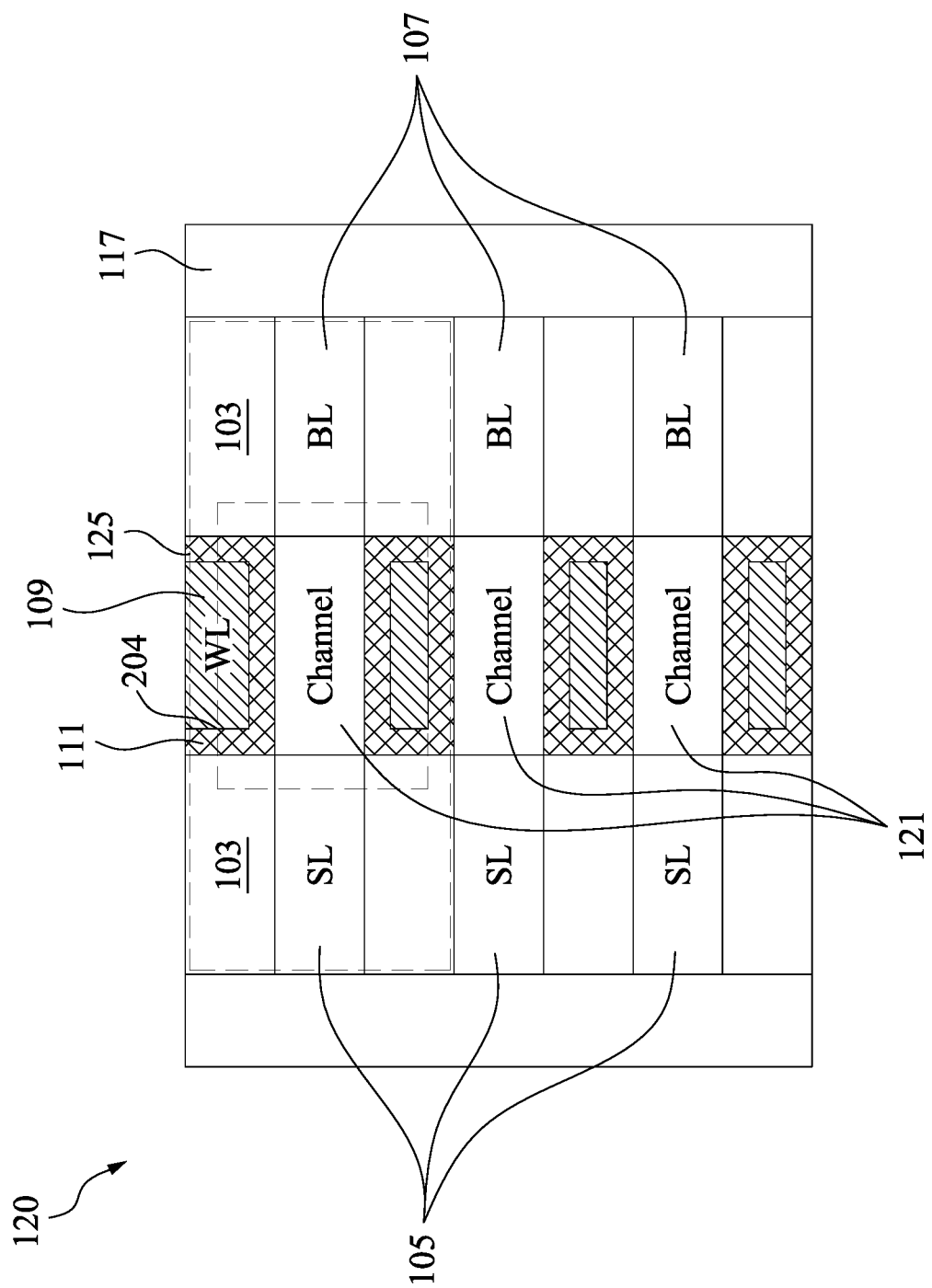
FIGS. 1D, 1E, 1F, and 1G illustrate the 3D NOR memory array, in accordance with some embodiments.
Figure 1E:
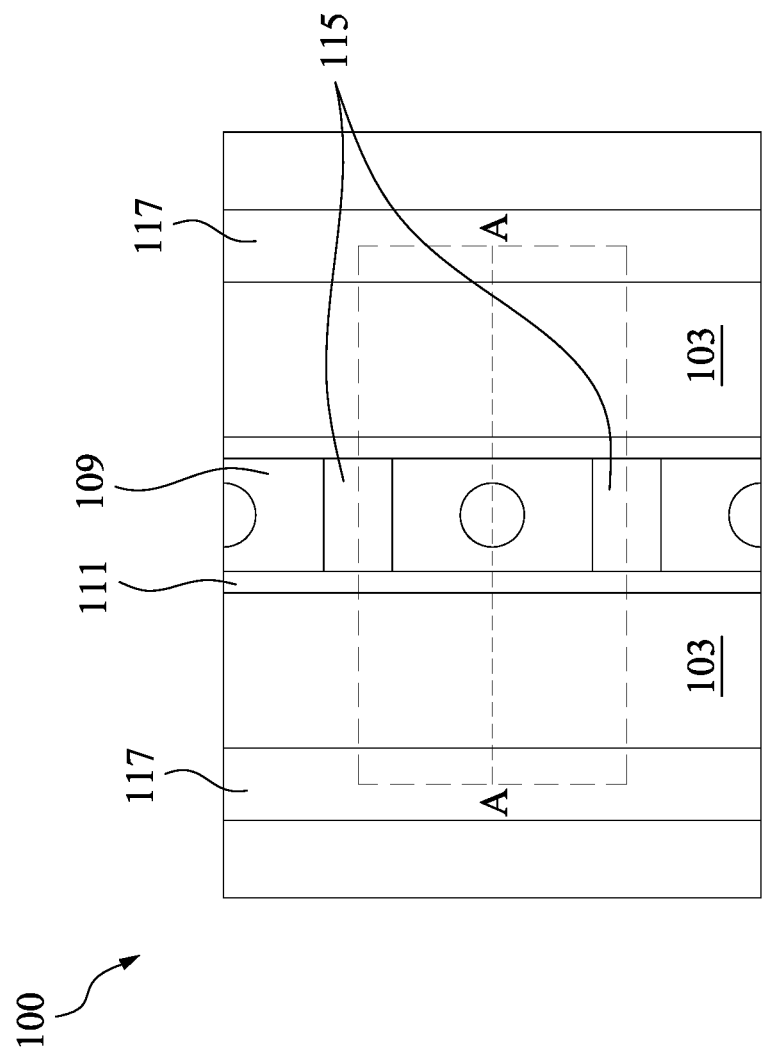

FIG. 1A further illustrates word lines 109 of the vertically stacked memory cells 125 that are separated from a respective semiconductor channel region 121 (see FIGS. 1D and 1F) of each transistor 204 by a memory film 111 within the 3D memory array 100. Each of the word lines 109 further functions as a gate for a respective transistor 204 (see FIG. 1D). Further still, FIG. 1A illustrates gate isolation plugs 115 that separate the word lines 109 of the stacked memory cells 125 from one another, and array spacers 117 separating the adjacent rows of memory cells 125 from each other. Memory cells 125 in a same vertical column of the memory array 100 may share a common word line 109. FIG. 1E illustrates a top-down view of a memory cell 125, which includes a word line 109 that is separated by the gate isolation plugs 115. FIG. 1E further illustrates array spacers 117 separating the memory cell 125 from adjacent memory cells in another row of the memory array 100 (see FIG. 1A). The memory film 111 is also shown in the magnified top-down view of the memory cell 125 in FIG. 1E.

A first source/drain region of each transistor 204 is electrically coupled to a respective bit line 107, and a second source/drain region of each transistor 204 (see FIGS. 1D and 1F) is electrically coupled to a respective source line 105, which electrically couples the second source/drain region to ground. In some embodiments, memory cells 125 at a same vertical height in a column of the memory array 100 may share a common source line 105 and a common bit line 107. A cross-sectional view of the cut-line A-A of FIG. 1A is shown in FIG. 1D according to some embodiments, in which a memory cell stack 120 of the 3D memory array 100 comprises a common word line 109 that is shared by a plurality of transistors 204. In addition FIG. 1D also shows that the isolation layers 103 separate the source lines 105 from one another and the bit lines 107 from one another. Further, FIG. 1D shows the semiconductor channel regions 121 that separate the source lines 105 from the bit lines 107 of each transistor 204 of a memory cell 125.

The semiconductor channel regions 121 (shown in FIGS. 1D, 1F, and 1G) may provide channel regions for the transistors 204 of a plurality of memory cells 125. In some embodiments, the semiconductor channel region 121 of a transistor 204 comprises a thin-film oxide semiconductor material, and the memory film 111 comprises a ferroelectric (FE) material that provides a gate dielectric for transistor 204. When an appropriate voltage (e.g., higher than a respective threshold voltage ($V_{th}$) of a corresponding transistor 204) is applied through a corresponding word line 109, a region of the semiconductor channel region 121 that intersects the word line 109 may allow current to flow from the bit line 107 to the source line 105.

In embodiments where the memory film 111 comprises a ferroelectric material, it may be polarized in one of two different directions. The polarization direction may be changed by applying an appropriate voltage differential across the memory film 111 and generating an appropriate electric field. The polarization may be relatively localized (e.g., generally contained within boundaries of each of the memory cells 125), and a continuous region of the memory film 111 may extend across a plurality of memory cells 125 in a column of the memory array 100. Depending on a polarization direction of a particular region of the memory film 111, a threshold voltage of a corresponding transistor 204 varies, and a digital value (e.g., 0 or 1) can be stored. For example, when a region of the memory film 111 has a first electrical polarization direction, the corresponding transistor 204 may have a relatively low threshold voltage, and when the region of the memory film 111 has a second electrical polarization direction, the corresponding transistor 204 may have a relatively high threshold voltage. The difference between the two threshold voltages may be referred to as the threshold voltage shift. A larger threshold voltage shift makes it easier (e.g., less error prone) to read the digital value stored in the corresponding memory cell 125.

To perform a write operation on a memory cell 125, a write voltage is applied across a portion of the memory film 111 corresponding to the memory cell 125. The write voltage can be applied, for example, by applying appropriate voltages to a corresponding word line 109 and the corresponding bit line 107/source line 105). By applying the write voltage across the portion of the memory film 111, a polarization direction of the region of the memory film 111 can be changed. As a result, the corresponding threshold voltage of the corresponding transistor 204 can also be switched from a low threshold voltage to a high threshold voltage or vice versa, and a digital value can be stored in the memory cell 125. Because the word lines 109 intersect the source lines 105 and the bit lines 107, individual memory cells 125 may be selected for the write operation.

To perform a read operation on the memory cell 125, a read voltage (a voltage between the low and high threshold voltages) is applied to the corresponding world line 109. Depending on the polarization direction of the corresponding region of the memory film in, the transistor 204 of the memory cell 125 may or may not be turned on. As a result, the bit line 107 may or may not be discharged through the source line 105 and the digital value stored in the memory cell 125 can be determined. Because the word lines 109 intersect the source lines 105 and the bit lines 107, individual memory cells 125 may be selected for the read operation.

FIG. 1B illustrates a top-down view of the memory array 100, according to some embodiments. In FIG. 1B, the topmost layer of the isolation layers 103 has been removed for illustration purposes to allow the underlying structures to be seen. The memory array 100 comprises a plurality of columns 1403 The column 1403 includes a plurality of vertically stacked source lines 105 adjacent to a plurality of vertically stacked bit lines 107. Each source line 105 and its corresponding bit line 107 functions as a source line and a bit line, respectively, to a plurality of memory cells 125 in the column 1403. Each of the columns 1403 comprises word lines 109. Each column 1403 includes a set of staircase contact areas 1307 that comprise conductive contacts 1309 extending to each source line 105 and another set of staircase contact areas 1307 that comprise conductive contacts 1309 extending to each bit line 107. The conductive contacts 1309 and 1307 to connect the source lines 105/bit lines 107 to overlying source lines 105/bit lines 107 for additional connections to active devices formed on an underlying substrate 101. Each staircase contact areas 1307 is associated with a stack of source lines 105 (e.g., SL1, SL2, SL3 see FIG. 1C) or bit lines 107 (e.g., BL1, BL2, BL3 see FIG. 1C).

FIG. 1B further illustrates the memory cell 125 in a column 1403 of the 3D-memory array 100. According to some embodiments, the word lines 109 of memory cells 125 in adjacent columns 1403 of the memory array 100 are aligned with one another. In other embodiments, the word lines 109 of memory cells 125 in adjacent columns 1403 of the memory array 100 may be offset from one another having a staggered pattern from one column 1403 to the next column 1403. According to some embodiments, conductive word line structures 1405 may be formed to the conductive contacts 1309 to connect the word lines 109 to active devices (e.g., control circuitry) on the underlying substrate 101. In the illustrated embodiment, the word lines 109 of adjacent ones of the columns 1403 are electrically connected to one another by one of the conductive word line structures 1405 (e.g., WL1, WL2, WL3, WL4). In embodiments which have word lines 109 in a staggered arrangement, the conductive word line structures 1405 may connect the word lines 109 that are aligned with other word lines 109 of the staggered arrangement one to another within the memory array 100.

FIG. 1C is a schematic diagram of an equivalent circuit of the 3D-NOR memory array 100 illustrated in the FIGS. 1A through 1B. In particular, FIG. 1C illustrates a plurality of columns 1403 each comprising a plurality of memory cells 125, and conductive word line structures 1405 associated with sets of the word lines 109 of the 3D-memory arrays 100 which are designated, e.g., WL1, WL2, WL3, WL4. FIG. 1C further illustrates the conductive source line structures 1407 associated with the stack of source lines 105 (e.g., SL1, SL2, SL3) of the memory array 100 and the conductive bit line structures 1409 associated with the stack of bit lines 107 (e.g., BL1, BL2, BL3) of the memory array 100. FIG. 1C further illustrates the memory cell 125 of the equivalent circuit associated with the dashed line of the FIG. 1A and FIG. 1B.

Figure 1F:
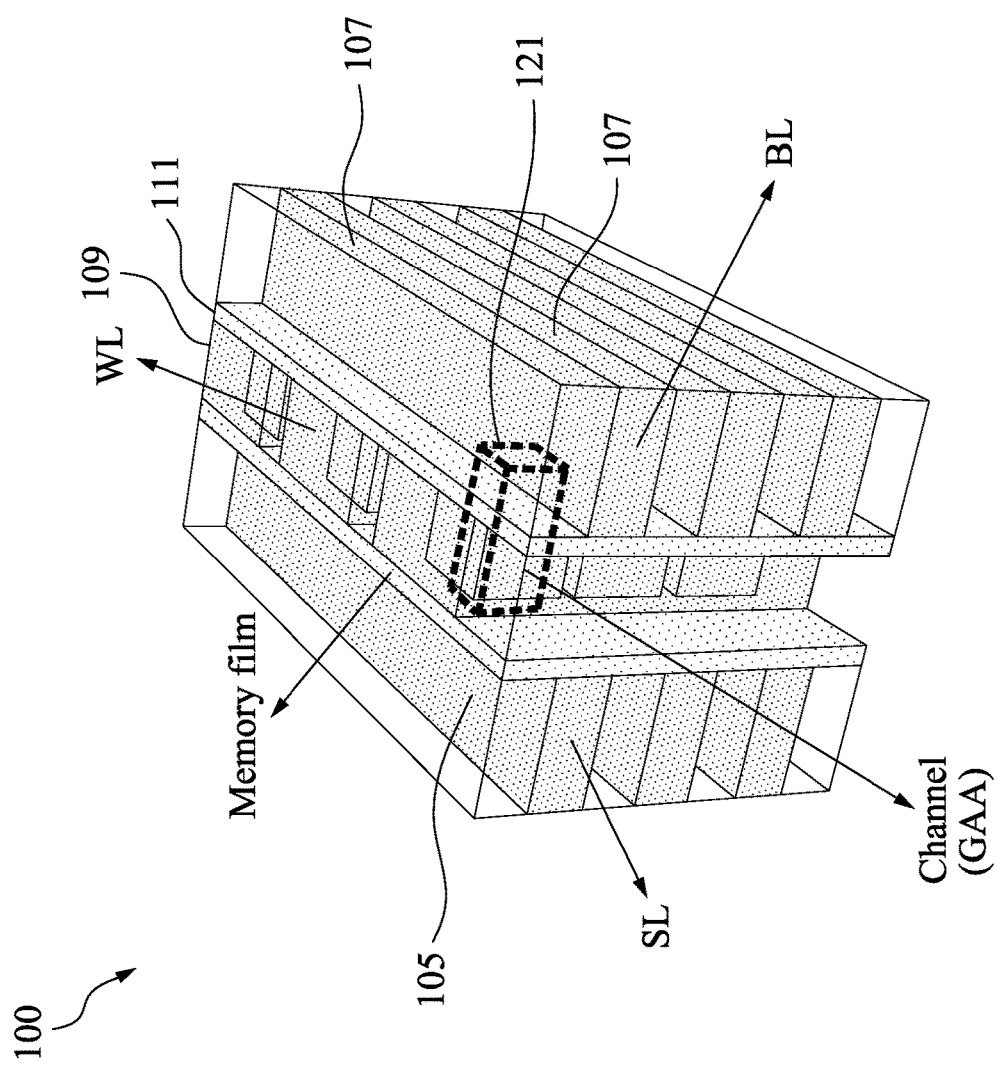
Figure 1G:
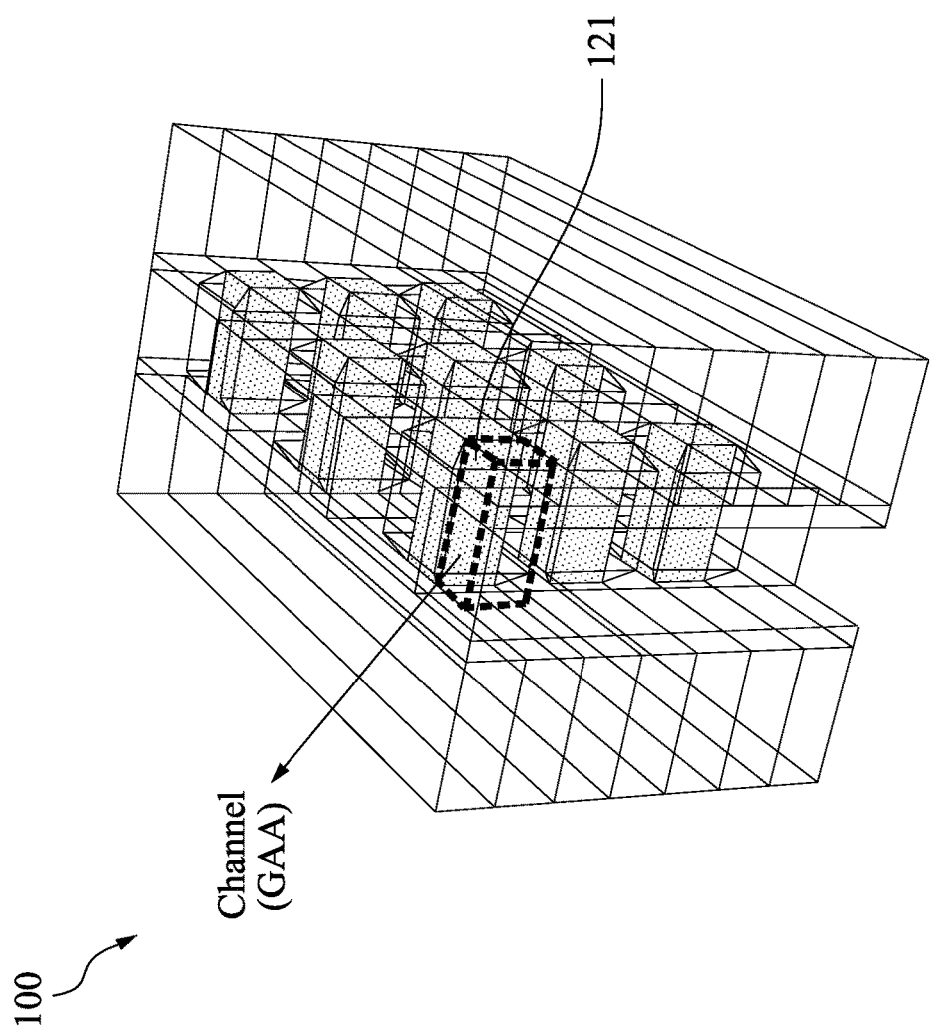

FIG. 1F through 1G illustrates perspective mesh views of a portion of the memory array 100, in accordance with some embodiments. In FIG. 1F the isolation layers 103 are transparent to show the source lines 105 and the bit lines 107 as well as the memory film 111. In addition the word lines 109 are also illustrated in FIG. 1F. In FIG. 1G, the isolation layers 103, the source lines 105, the bit lines 107, the memory film in and the word lines 109 are shown as transparent to show the semiconductor channel region 121 that forms the channel region of the transistor 204.

Figure 2:
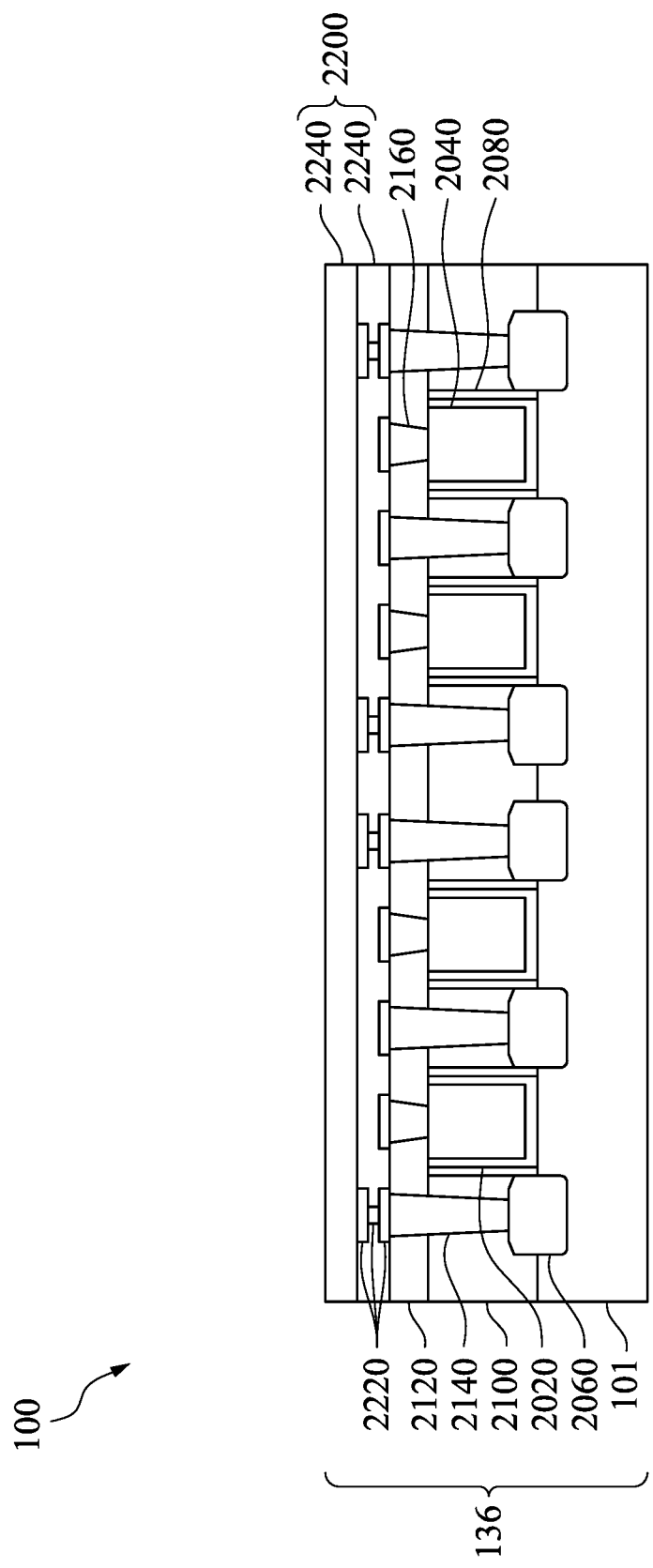
FIGS. 2, 3A, 3B, 4, 5, 6, 7, 8, 9A, 9B, 9C, 9D, 9E, 10, 11, 12A, 12B, 12C, 12D, 12E, 12F, 13A, 13B, 13C, 13D, 13E, 13F, and 13G illustrate perspective, cross-sectional and top-views of intermediate stages in the manufacture of the 3D NOR memory array, in accordance with embodiments.

With reference now to FIGS. 2-13G, these figures illustrate intermediate stages in the formation of the 3D memory array 100, in accordance with some embodiments. In FIG. 2, a substrate 101 is provided. The substrate 101 may be a semiconductor substrate, such as a bulk semiconductor, a semiconductor-on-insulator (SOI) substrate, or the like, which may be doped (e.g., with a p-type or an n-type dopant) or undoped. The substrate 101 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 101 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 101 to form a structure 136. The circuits include active devices (e.g., transistors) at a top surface of the substrate 101. The transistors may include gate dielectric layers 2020 over top surfaces of the substrate 101 and gate electrodes 2040 over the gate dielectric layers 2020. Source/drain regions 2060 are disposed in the substrate 101 on opposite sides of the gate dielectric layers 2020 and the gate electrodes 2040. Gate spacers 2080 are formed along sidewalls of the gate dielectric layers 2020 and separate the source/drain regions 2060 from the gate electrodes 2040 by appropriate lateral distances. In some embodiments, the transistors may be planar field effect transistors (FETs), fin field effect transistors (finFETs), nano-field effect transistors (nanoFETs), or the like.

A first ILD 2100 surrounds and isolates the source/drain regions 2060, the gate dielectric layers 2020, and the gate electrodes 2040 and a second ILD 2120 is over the first ILD 2100. Source/drain contacts 2140 extend through the second ILD 2120 and the first ILD 2100 and are electrically coupled to the source/drain regions 2060 and gate contacts 2160 extend through the second ILD 2120 and are electrically coupled to the gate electrodes 2040. An interconnect structure 2200, including one or more stacked dielectric layers 2240 and conductive features 2220 formed in the one or more dielectric layers 2240, is over the second ILD 2120, the source/drain contacts 2140, and the gate contacts 2160. Although FIG. 2 illustrates two stacked dielectric layers 2240, it should be appreciated that the interconnect structure 2200 may include any number of dielectric layers 2240 having conductive features 2220 disposed therein. The interconnect structure 2200 may be electrically connected to the gate contacts 2160 and the source/drain contacts 2140 to form functional circuits. In some embodiments, the functional circuits formed by the interconnect structure 2200 may comprise logic circuits, memory circuits, sense amplifiers, controllers, input/output circuits, image sensor circuits, the like, or combinations thereof. Although FIG. 2 discusses transistors formed over the substrate 101, other active devices (e.g., diodes or the like) and/or passive devices (e.g., capacitors, resistors, or the like) may also be formed as part of the functional circuits.

Figure 3A:
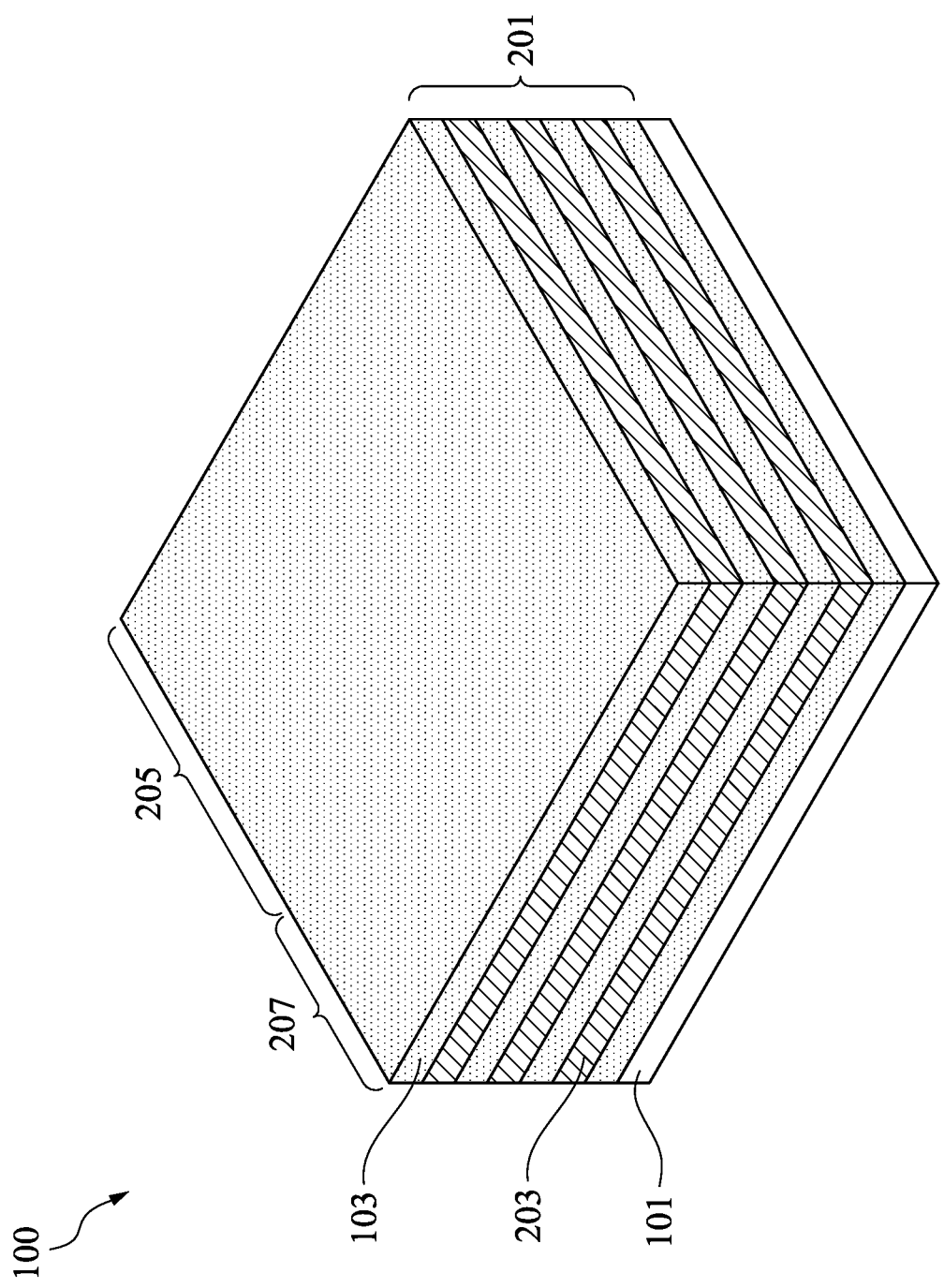
Figure 3B:
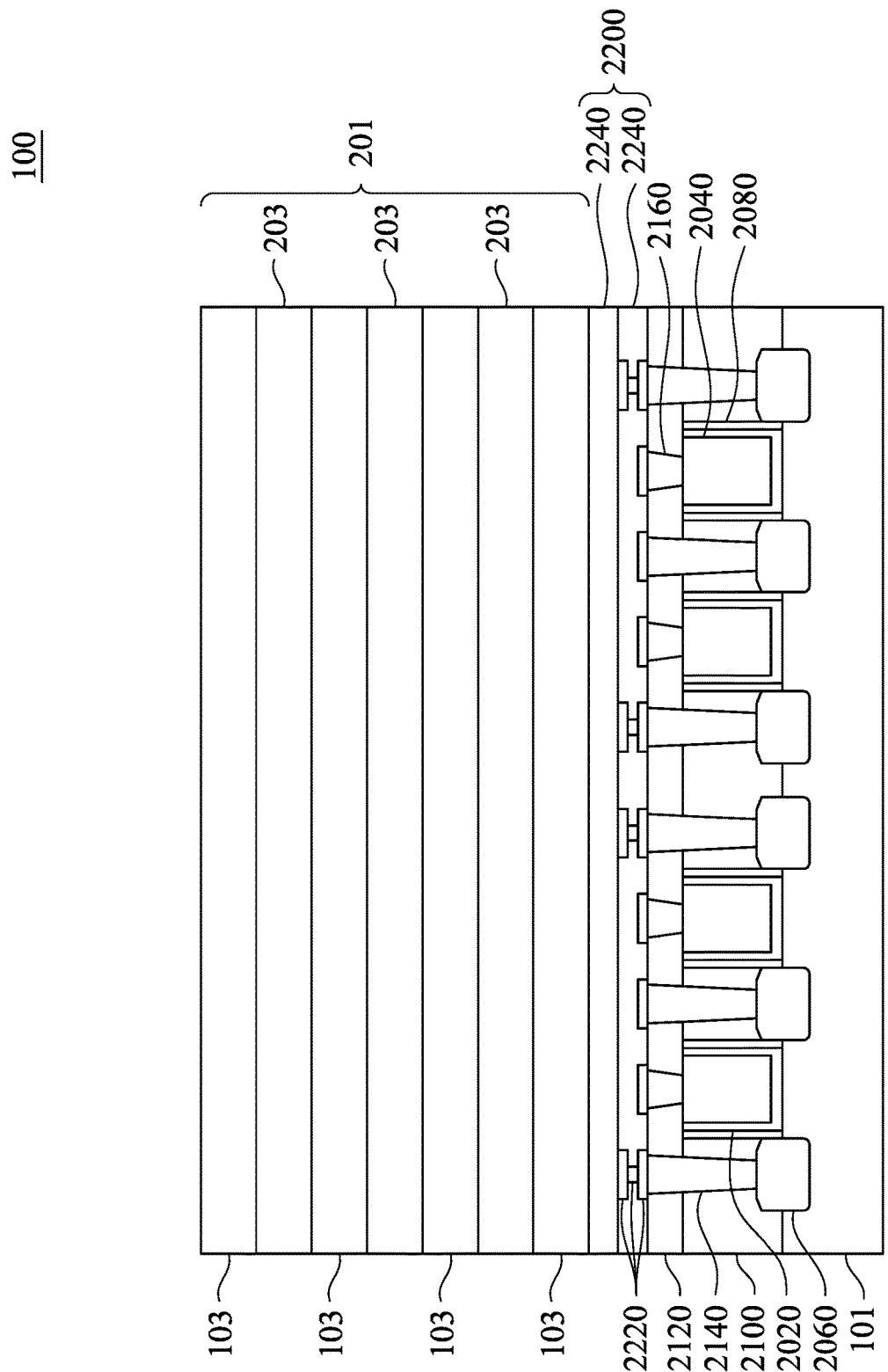

FIGS. 3A through 3B illustrate forming a multi-layer stack 201 over the structure of FIG. 2, in accordance with some embodiments. The substrate 101, the transistors, the ILDs, and the interconnect structure 2200 may be omitted from subsequent drawings for the purposes of simplicity and clarity. Although the multi-layer stack 201 is illustrated as contacting the dielectric layers 2240 of the interconnect structure 2200, any number of intermediate layers may be disposed between the substrate 101 and the multi-layer stack 201. For example, one or more interconnect layers comprising conductive features in insulating layers (e.g., low-k dielectric layers) may be disposed between the substrate 101 and the multi-layer stack 201. In some embodiments, the conductive features may be patterned to provide power, ground, and/or signal lines for the active devices on the substrate 101 and/or the memory array 100 (see FIG. 1A).

The multi-layer stack 201 includes alternating layers of isolation layers 103 and dummy semiconductor layers 203. The isolation layers 103 may be a dielectric material (e.g., an oxide such as silicon oxide, SiN, SiON, or the like). The dummy semiconductor layers 203 may be formed of a thin-film oxide semiconductor material such as zinc oxide (ZnO), indium gallium zinc oxide (IGZO), indium tungsten oxide (IWO), indium tin oxide (ITO), indium gallium zinc tin oxide (IGZTO), or the like. The isolation layers 103 and the dummy semiconductor layers 203 may be formed using, for example, chemical vapor deposition (CVD), atomic layer deposition (ALD), physical vapor deposition (PVD), or the like. However, any suitable materials and deposition processes may be utilized to form the dummy semiconductor layer 203

The multi-layer stack 201 may be formed by initially depositing a first one of the isolation layers 103 over the structure of FIG. 2. According to an embodiment, the isolation layers 103 may be formed by depositing a bulk layer (e.g., an oxide) using a CVD process or an ALD process. However, any suitable material and/or suitable deposition process may be used. Once deposited, an optional anneal process (e.g., rapid thermal anneal, oxidation densification, or the like) and/or an optional planarization process (e.g., chemical mechanical planarization) may be performed to harden and/or planarize the first one of the isolation layers 103.

Once the first one of the isolation layers 103 has been formed, a first one of the dummy semiconductor layers 203 may be formed over the first one of the isolation layers 103. According to an embodiment, the dummy semiconductor layers 203 may be formed by depositing a thin-film oxide semiconductor material (e.g., zinc oxide (ZnO), or the like) in an ALD, CVD, PVD process or the like.

Once the first one of the dummy semiconductor layers 203 has been formed, further isolation layers 103 and further dummy semiconductor layers 203 may be formed in the multi-layer stack 201 in an alternating fashion one over the other until a desired topmost layer of the dummy semiconductor layers 203 and a topmost layer of the isolation layers 103 have been formed. Any suitable number of isolation layers 103 and any suitable number of dummy semiconductor layers 203 may be formed in the multi-layer stack 201.

FIG. 3A further illustrates a first region 205 of the multi-layer stack 201. The first region 205 may be designated for forming the 3D memory array 100, according to some embodiments. In addition, a second region 207 of the multi-layer stack 201 is adjacent the first region 205 and may be designated for forming connectors which connect the memory array 100 to underlying active devices and/or signal, power, and ground lines in the semiconductor die.

Figure 4:
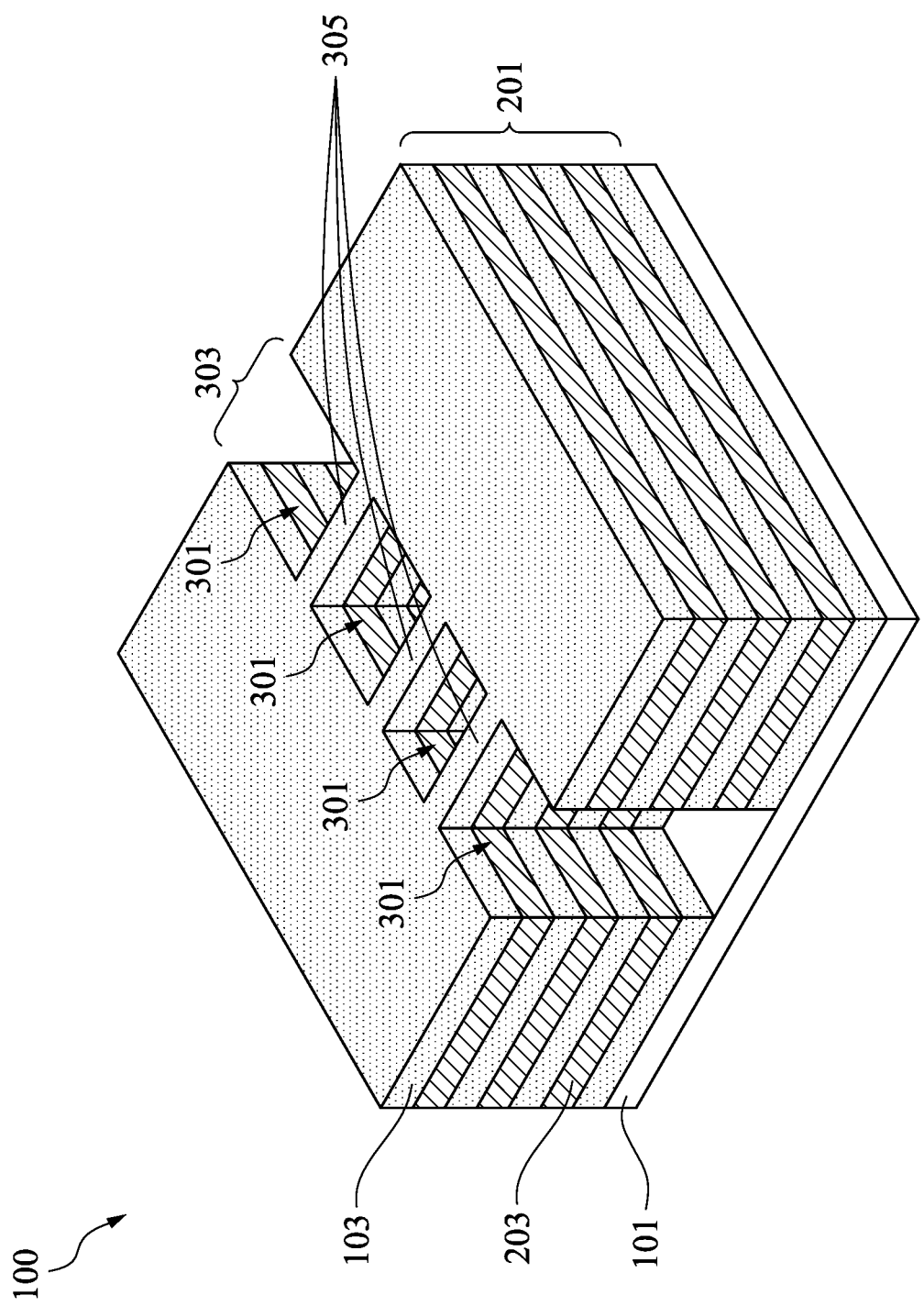

FIG. 4 illustrates the formation of gate trenches 301 within a channel region 303 of the multi-layer stack 201, according to some embodiments. The channel region 303 may also be referred to herein as a word line region. The gate trenches 301 may be formed by initially forming a photoresist (not shown) over the multi-layer stack 201. The photoresist may be formed using a spin-on technique and can be patterned using acceptable photolithography techniques. The photoresist may be patterned to expose the surface of the topmost layer of the multi-layer stack 201 in desired locations of the gate trenches 301. The gate trenches 301 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over multi-layer stack 201 and patterned using a photolithography process. Spacers are formed (not shown) alongside the patterned sacrificial layer using a self-aligned process, and the sacrificial layer may be removed.

Once formed, the spacers may be used as a mask to etch the materials of the isolation layers 103 and the materials of the dummy semiconductor layers 203 exposed through the mask. The etching may be one or more of any acceptable etch processes, such as by wet or dry etching, a reactive ion etch (RIE), neutral beam etch (NBE), the like, or a combination thereof. The etching may be anisotropic. In some embodiments, the mask may be used with multiple separate etching processes to remove exposed materials of the isolation layers 103 and to remove exposed materials of the dummy semiconductor layers 203. However, the mask may also be used with a single etching process to etch through both of the materials of the isolation layers 103 and the dummy semiconductor layers 203.

According to some embodiments, a first etch chemical that is selective to the isolation layers 103 and relatively non-selective to the dummy semiconductor layers 203 may be used to form the gate trenches 301 through the isolation layers 103 and stopping on the dummy semiconductor layers 203. A second etch chemical that is selective to the dummy semiconductor layers 203 and relatively non-selective to the isolation layers 103 may be used to form the gate trenches 301 through the dummy semiconductor layers 203 and stop on the isolation layers 103. For example, a chlorine or fluorine-based gas such as chlorine ($Cl_2$) or hydrogen fluoride (HF), or the like, may be used to selectively etch the dummy semiconductor layers 203 without substantively removing the material of the isolation layers 103. The isolation layers 103 may be selectively etched using a wet etch chemical that comprises phosphorus, (e.g., $H_3PO_4$, or the like) without substantively removing the material of the dummy semiconductor layers 203. In other embodiments, a single etching process may be used to remove both materials of the isolation layers 103 and the dummy semiconductor layers 203, such as with an etching process that is selective to the multi-layer stack 201.

According to some embodiments, timed etch processes may be used to stop the etching of the gate trenches 301 after the trenches have reach a desired depth. For example, the timed etch process may be timed to stop at the surface of the structure 136, although the timed etch process may be timed to etch into the structure 136 to a desired depth. According to some embodiments, an optional contact etch stop layer (not shown) may be provided at an interface between the structure 136 and the multi-layer stack 201. The optional contact etch stop layer (not shown) may comprise a dielectric material, such as, silicon nitride, silicon oxide, silicon oxynitride, or the like, having a different etch rate than the materials of an overlying layer of the multi-layer stack 201. In such embodiments, the optional contact etch stop layer (not shown) is formed via a suitable deposition process (e.g., atomic layer deposition, chemical vapor deposition, physical vapor deposition, or the like) over the structure 136 prior to the formation of the multi-layer stack 201 and the multi-layer stack 201 is formed over the optional contact etch stop layer (not shown). Furthermore, an additional etch process may be used to remove materials of the optional contact etch stop layer (not shown) such that the structure 136 is exposed at the bottom of the gate trenches 301.

Once patterned, the remaining portions of the multi-layer stack 201 between the gate trenches 301 form a plurality of strips 305. As such, the gate trenches 301 are separated by the strips 305. Although the embodiment illustrated in FIG. 4 shows each of the strips 305 having the same width, widths of the strips 305 of the memory array 100 located in one region of the multi-layer stack 201 may be greater or thinner than the strips 305 of the memory array 100 located in another region of the multi-layer stack 201. Further, while each of the gate trenches 301 are illustrated as having a consistent width throughout, according to some embodiments. In other embodiments, the gate trenches 301 and thus the strips 305 may have tapered sidewalls such that a width of each of the strips 305 continuously increases in a direction towards the substrate 101. In such embodiments, each of the isolation layers 103 and the dummy semiconductor layers 203 may have a different width in a direction perpendicular to the sidewalls of the strips 305.

Figure 5:
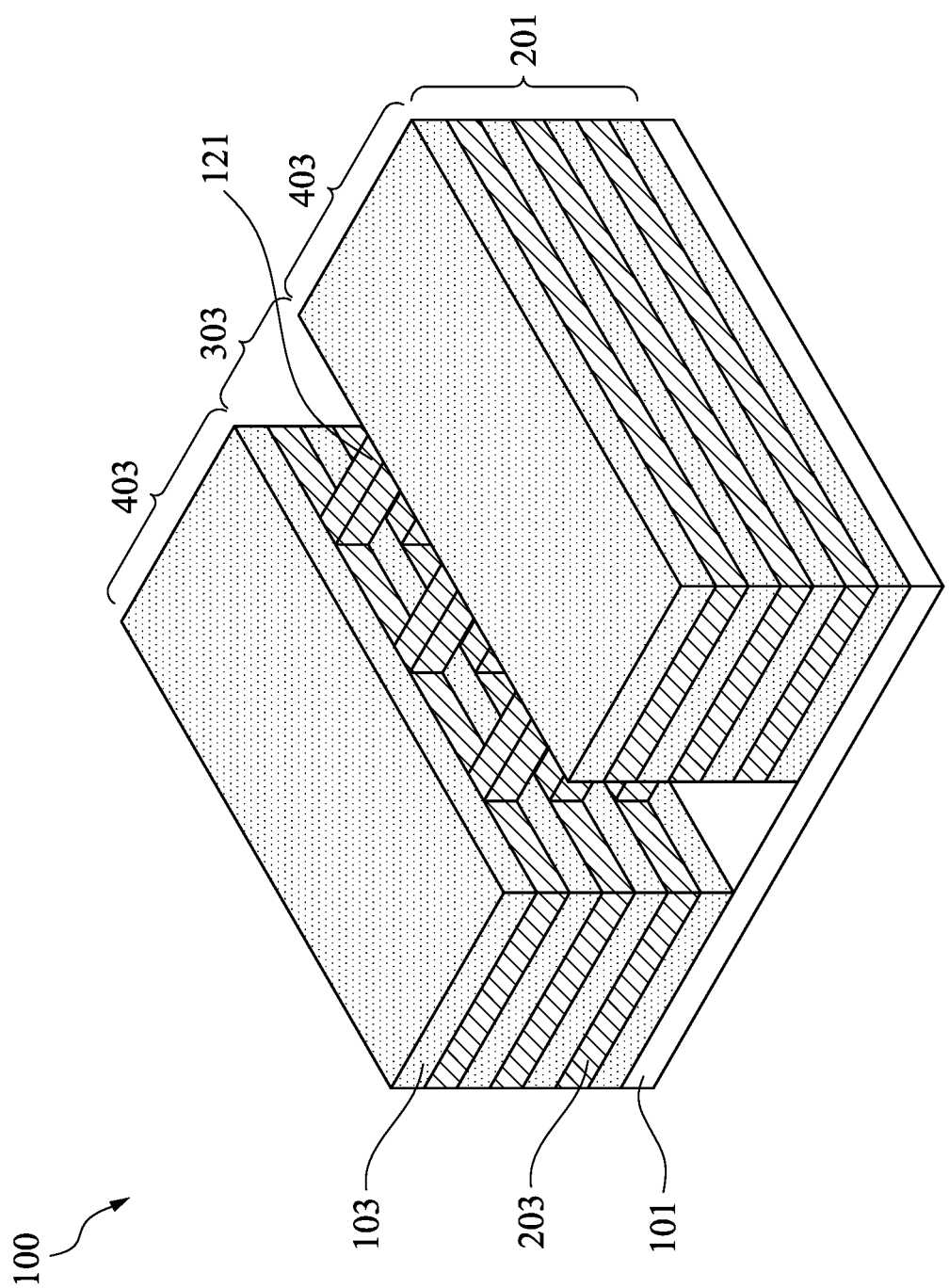

FIG. 5 illustrates a wire-release process for forming the semiconductor channel regions 121 from the dummy semiconductor layers 203. Once the gate trenches 301 have been formed, according to some embodiments, the spacers and/or photoresist used to form the gate trenches 301 in FIG. 4 may be removed and a mask layer (not shown) for use in the wire-release process may be formed over the multi-layer stack 201 and patterned to expose the channel region 303. In other embodiments, the spacers and/or photoresist layer used to form the gate trenches 301 may be retained and the mask layer for use in the wire-release process is formed over the spacers and the photoresist layer. In such embodiments, the mask layer may be formed over the photoresist and/or the spacers and then patterned to expose the portions of the photoresist and/or the spacers covering the gate trenches 301 and/or the strips 305 in the channel region.

According to some embodiments, the mask layer may be a conductive or non-conductive material and may be selected from a group including silicon nitride, silicon oxynitride, amorphous silicon, polycrystalline-silicon (poly-silicon), poly-crystalline silicon-germanium (poly-SiGe), metallic nitrides, metallic silicides, metallic oxides, and metals. The mask layer may be deposited by physical vapor deposition (PVD), CVD, ALD, sputter deposition, or other techniques for depositing the selected material. Once the material of the mask layer has been deposited, the material may be patterned using, e.g., a photolithographic masking and etching process. Once the mask layer is patterned, the exposed portions of the photoresist and/or the spacers are removed using one or more suitable removal processes (e.g., ashing, selective etching, combinations, or the like).

Once the mask layer has been formed and patterned, the sidewalls of the gate trenches 301 and thus the sidewalls of the strips 305 are exposed. As such, the material of the isolation layers 103 of the strips 305 may be removed from between the substrate 101 and the dummy semiconductor layers 203 in a wire release process step. As such, the remaining material of strips 305 (e.g., the dummy semiconductor layers 203) form semiconductor channel regions 121 between source/bit line regions 403 of the multi-layer stack 201. The semiconductor channel regions 121 may be referred to herein as wires, nanowires, sheets, or nanosheets. In an embodiment the isolation layers 103 of the strips 305 may be removed using a wet etching process that selectively removes the material of the isolation layers 103 without significantly removing the material of the semiconductor channel regions 121 within the channel region 303 and without significantly removing the material of the isolation layers 103 and the material of the dummy semiconductor layers 203 of the source/bit line regions 403 of the multi-layer stack 201. However, any other suitable removal process may be utilized.

For example, in an embodiment, an etch chemical containing phosphorous (e.g., $H_3PO_4$) may be used to selectively remove the material of the isolation layers 103 (e.g., silicon oxide) without substantively removing the material of the semiconductor channel regions (e.g., zinc oxide (ZnO)) and/or the material of the substrate 101. However, in other embodiments any other suitable etchant may be utilized to selectively remove the material of the isolation layers 103 (e.g., silicon oxide) without substantively removing the material of the semiconductor channel regions 121 (e.g., zinc oxide (ZnO)) and/or the material of the substrate 101.

By removing the material of the isolation layers 103, the sides of the semiconductor channel regions 121 are exposed and separated from each other within the channel region 303. The semiconductor channel regions 121 form a channel structure between opposite ones of the source/bit line regions 403. In some embodiments, a tuning selectivity of the etching process used to form the semiconductor channel regions 121 may be adjusted such that the semiconductor channel regions 121 are formed with smooth surfaces or comprising a plurality of faceted surfaces. As such, the semiconductor channel regions 121 may be formed with different profile shapes (e.g., round, square, rectangle, hexagon, octagon, or the like, as shown subsequently in FIGS. 12B through 12D). In the illustrated embodiment the semiconductor channel regions 121 are formed to have a square profile with the channel width being about the same as the original thicknesses of the dummy semiconductor layers 203, although the etching processes may also be utilized to reduce the thicknesses.

Once the semiconductor channel regions 121 have been formed, any remaining portions of the mask layer, the retained spacers and/or the retained photoresist may be removed using one or more suitable removal processes (e.g., wet etch, dry etch, or the like) that utilize one or more etchants that are selective to the materials of the mask layer, the retained spacers and/or the retained photoresist. However, any suitable removal process may be utilized.

Figure 6:
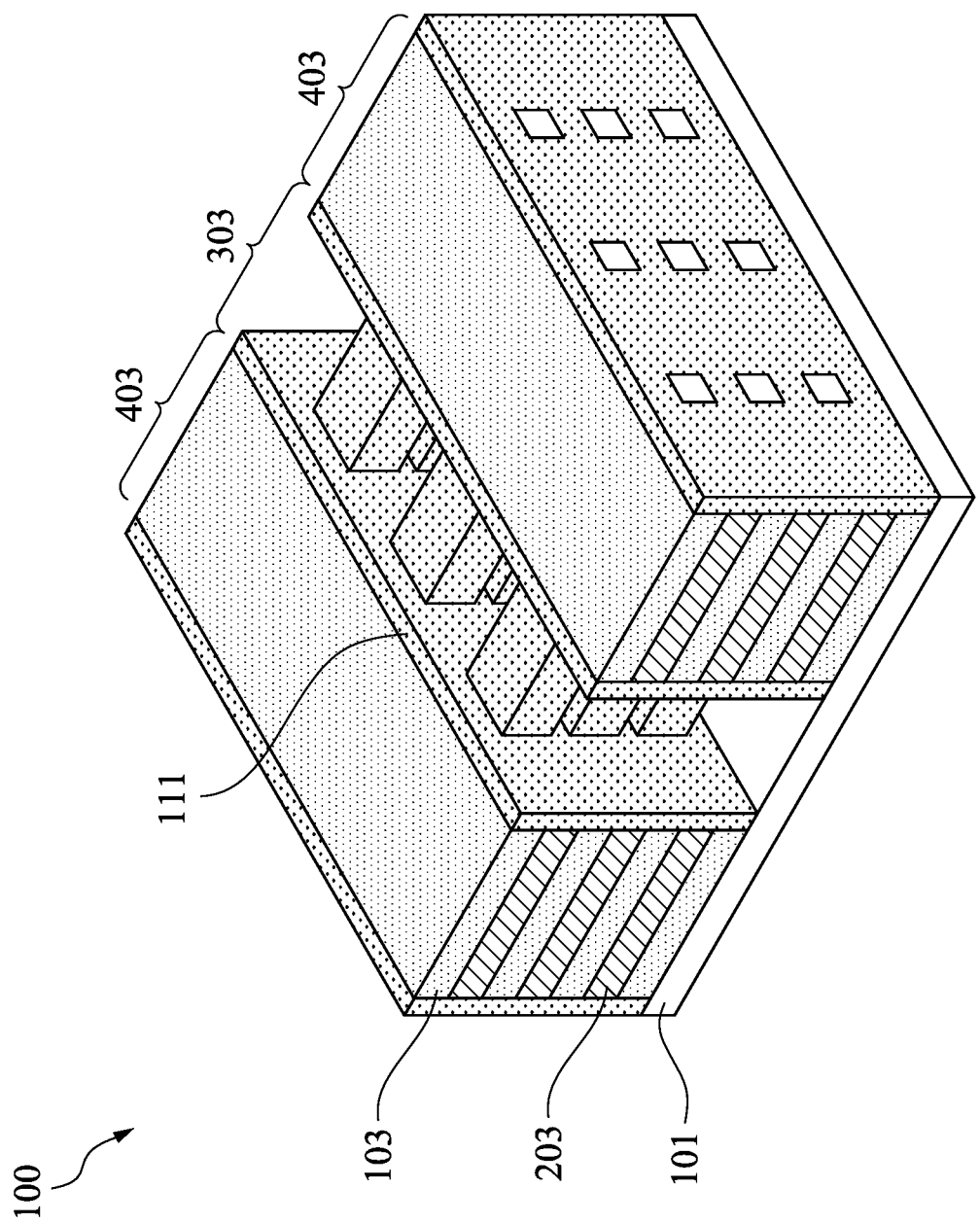

FIG. 6 illustrates the formation of the memory film 111 on top surfaces of the multi-layer stack 201, sidewalls of the source/bit line regions 403 in the channel region 303 of the multi-layer stack 201, and on exposed surfaces of the semiconductor channel regions 121 in between sidewalls of the source/bit line regions 403 in the channel region 303 of the multi-layer stack 201. The memory film 111 is formed as a conformal thin film. According to some embodiments, the memory film 111 may be formed using one or more layers of acceptable dielectric materials suitable for storing digital values, such as multilayer dielectrics (e.g., oxide-nitride-oxide (ONO), nitride-oxide-nitride (NON), or the like); other dielectrics (e.g., silicon oxynitride (SiON), silicon nitride (SiN), or the like); ferro-electric (FE) materials such as, hafnium zirconium oxide (HfZrO); zirconium oxide (ZrO); undoped hafnium oxide (HfO); doped hafnium oxides (e.g., HfLaO using lanthanum (La) as a dopant, HfSiO using silicon (Si) as a dopant, HfAlO using aluminum (Al) as a dopant, or the like); combinations; or the like. The material of the memory film 111 may be formed by an acceptable deposition process such as ALD, CVD, PVD, or the like. Once deposited, the materials of the memory film 111 may be planarized with the topmost layer of the isolation layers 103 using a process such as chemical mechanical planarization, an etch back process, combinations thereof, or the like.

Figure 7:
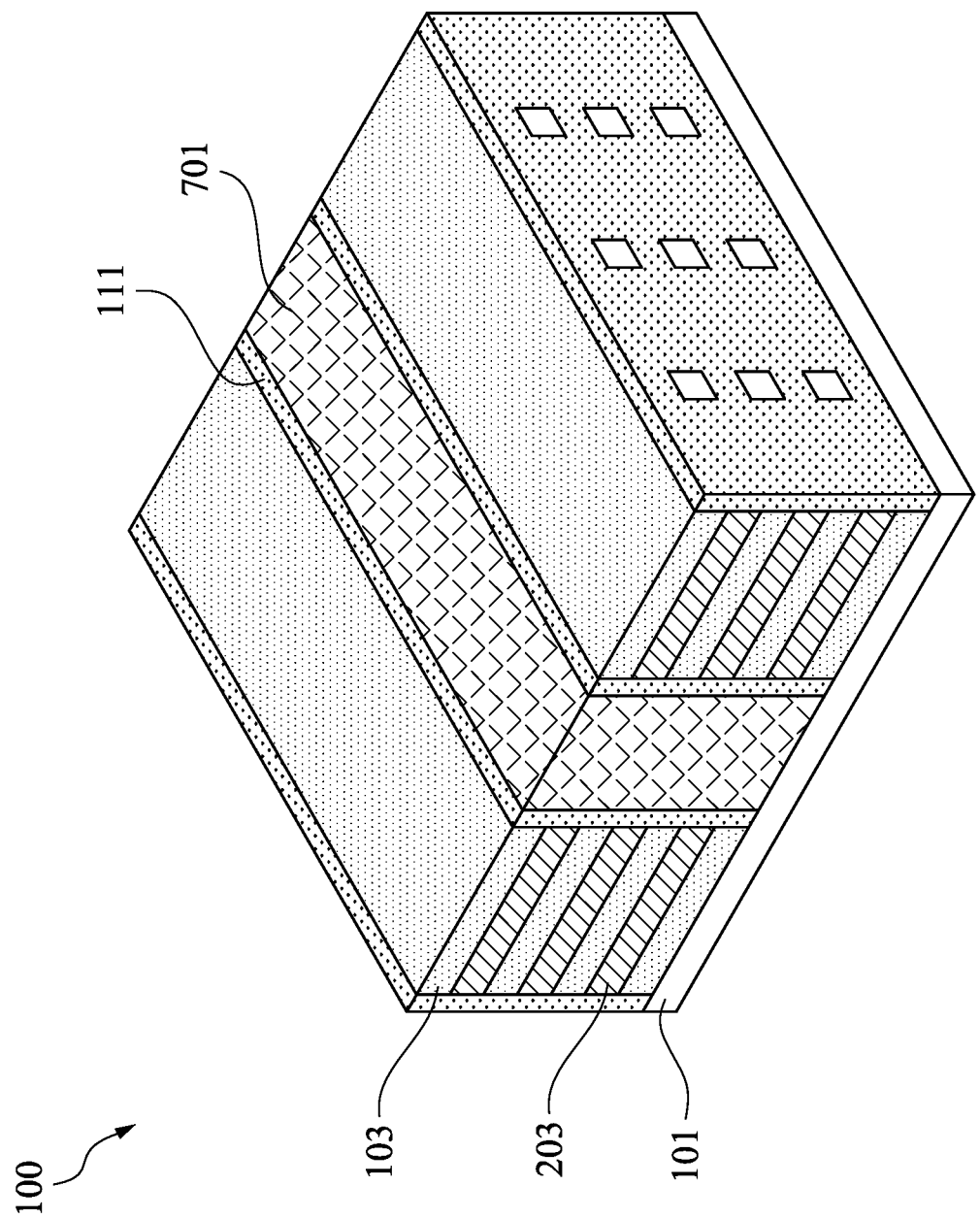

FIG. 7 illustrates the formation of a wrap-around word line structure 701 formed over the memory film 111 in the channel region 303 of the multi-layer stack 201 and a subsequent chemical mechanical planarization. The wrap-around word line structure 701 may comprise one or more layers, such as glue layers, barrier layers, diffusion layers, and fill layers, and the like. In some embodiments, the wrap-around word line structure 701 includes a glue layer and a conductive layer. The glue layer may be formed of metal nitride, such as titanium nitride, tantalum nitride, zirconium nitride, hafnium nitride, or the like. The conductive layer may be formed of a metal such as tungsten, cobalt, aluminum, nickel, copper, silver, gold, alloys thereof, or the like. The material of the glue layer is one that has good adhesion to the material of the memory film 111 and the material of the conductive layer is one that has good adhesion to the material of the glue layer. In embodiments where the memory film 111 is formed of an oxide such as oxide-nitride-oxide (ONO) film, the glue layer can be titanium nitride and the conductive layer can be tungsten. The glue layer and conductive layer may each be formed by an acceptable deposition process such as ALD, CVD, or the like. The materials of the wrap-around word line structure 701 may fill and overfill the remaining opening in the channel region 303 and may be formed over the top surfaces of the multi-layer stack 201 outside of the channel region 303. The conductive layer fills the remaining area of the gate trenches 301. Once deposited, the materials of the wrap-around word line structure 701 and the memory film 111 may be planarized with the topmost layer of the isolation layers 103 using a process such as chemical mechanical planarization, an etch back process, combinations thereof, or the like.

Figure 8:
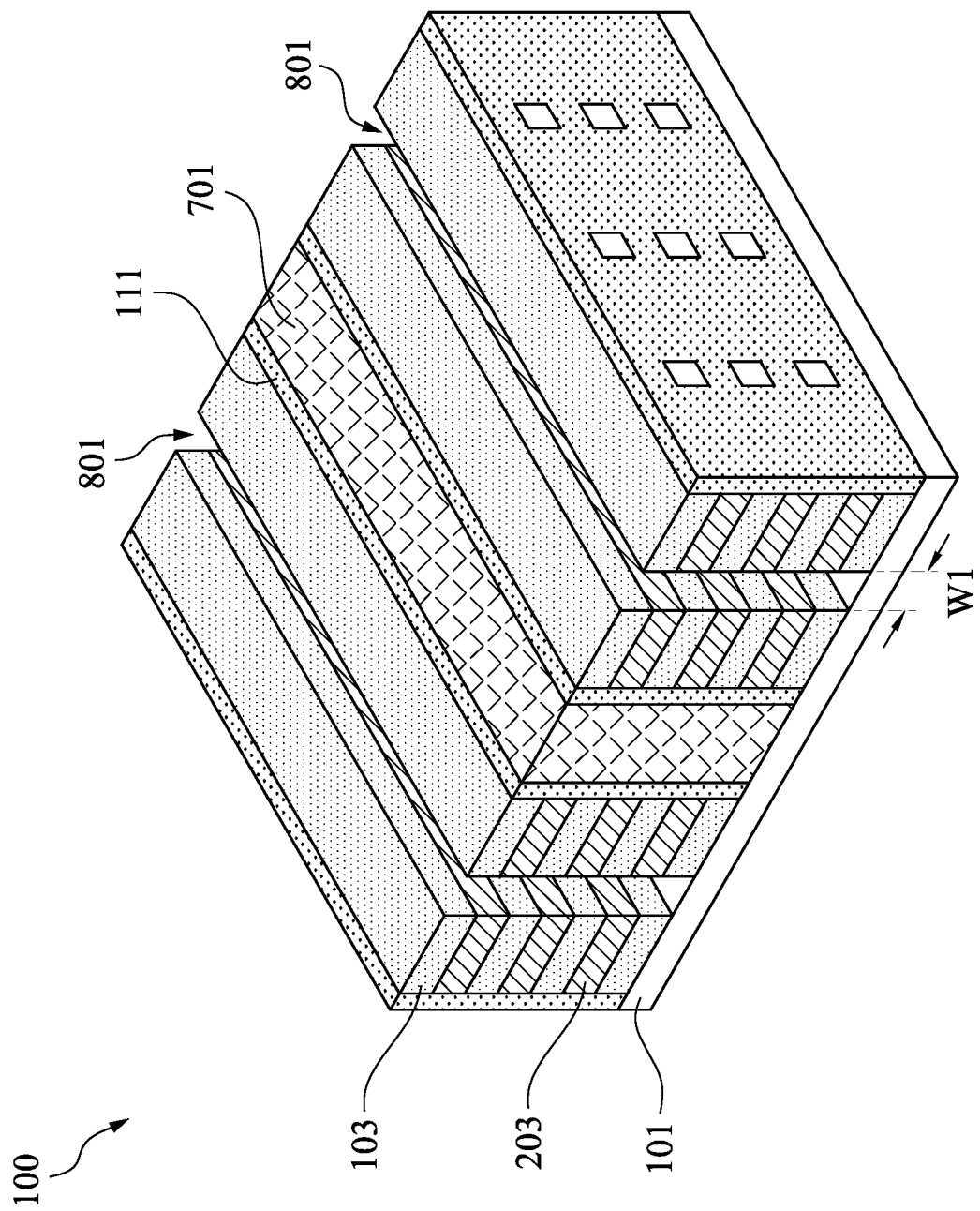

FIG. 8 illustrates the formation of openings 801 in the multi-layer stack 201. The openings 801 may be referred to herein as vertical slits, vertical trenches, or vertical array openings. In the illustrated embodiment, the openings 801 extend through the multi-layer stack 201 and expose the structure 136. The array slits 301 may be formed by initially forming a photoresist (not shown) over the multi-layer stack 201. The photoresist may be formed using a spin-on technique and can be patterned using acceptable photolithography techniques. The photoresist may be patterned to expose the surface of the topmost layer of the multi-layer stack 201 in desired locations of the openings 801. The openings 801 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over multi-layer stack 201 and patterned using a photolithography process. Spacers are formed alongside the patterned sacrificial layer using a self-aligned process, and the sacrificial layer may be removed.

Once formed, the spacers may be used as a mask to etch the materials of the isolation layers 103 and the materials of the dummy semiconductor layers 203 exposed through the mask. The etching may be one or more of any acceptable etch processes, such as by wet or dry etching, a reactive ion etch (RIE), neutral beam etch (NBE), the like, or a combination thereof. The etching may be anisotropic. In some embodiments, the mask may be used with multiple separate etching processes to remove exposed materials of the isolation layers 103 and to remove exposed materials of the dummy semiconductor layers 203. However, the mask may also be used with a single etching process to etch through both of the materials of the isolation layers 103 and the dummy semiconductor layers 203. In some embodiments, the openings 801 may be formed using any of the photolithography and anisotropic etching techniques suitable for forming the gate trenches 301, as set forth above in FIG. 4. However, other suitable photolithography and etching techniques may also be used to form the openings 801. According to some embodiments, the openings 801 may be formed with a first width W1.

Forming the openings 801 divides the multi-layer stack 201 and separates one region of the multi-layer stack 201 from adjacent regions of the multi-layer stack 201. In some embodiments, the adjacent regions of the multi-layer stack 201 may subsequently be used to form adjacent memory cells, although other structures may be also be formed in one or more of the adjacent regions.

Figure 9A:
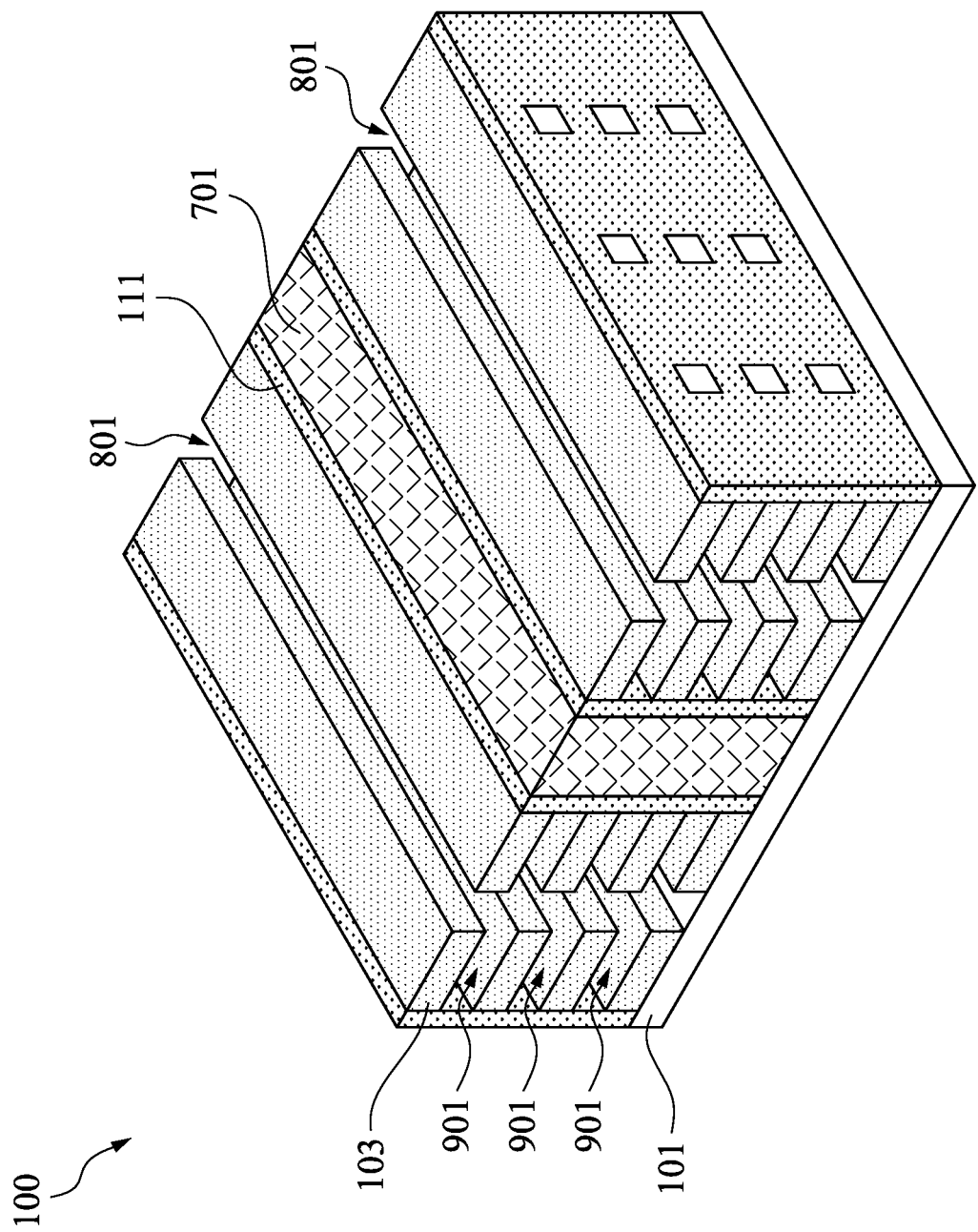

FIG. 9A illustrates the formation of source/bit line gaps 901 in the multi-layer stack 201. Once the openings 801 have been formed, the dummy semiconductor layers 203 are exposed at the sidewalls of the openings 801. As such, the source/bit line gaps 901 may be formed by any acceptable etching process, such as one that is selective to the material of the dummy semiconductor layers 203 (e.g., selectively etches the material of the dummy semiconductor layers 203 at a faster rate than the materials of the isolation layers 103). In some embodiments, a chlorine or fluorine-based gas such as chlorine ($Cl_2$) or hydrogen fluoride (HF), or the like, may be used to selectively etch the dummy semiconductor layers 203 without substantively removing the material of the isolation layers 103 to form the source/bit line gaps 901. The etching process may be a timed etching process or else may be ended using an endpoint detection process.

Figures 9B, 9C:
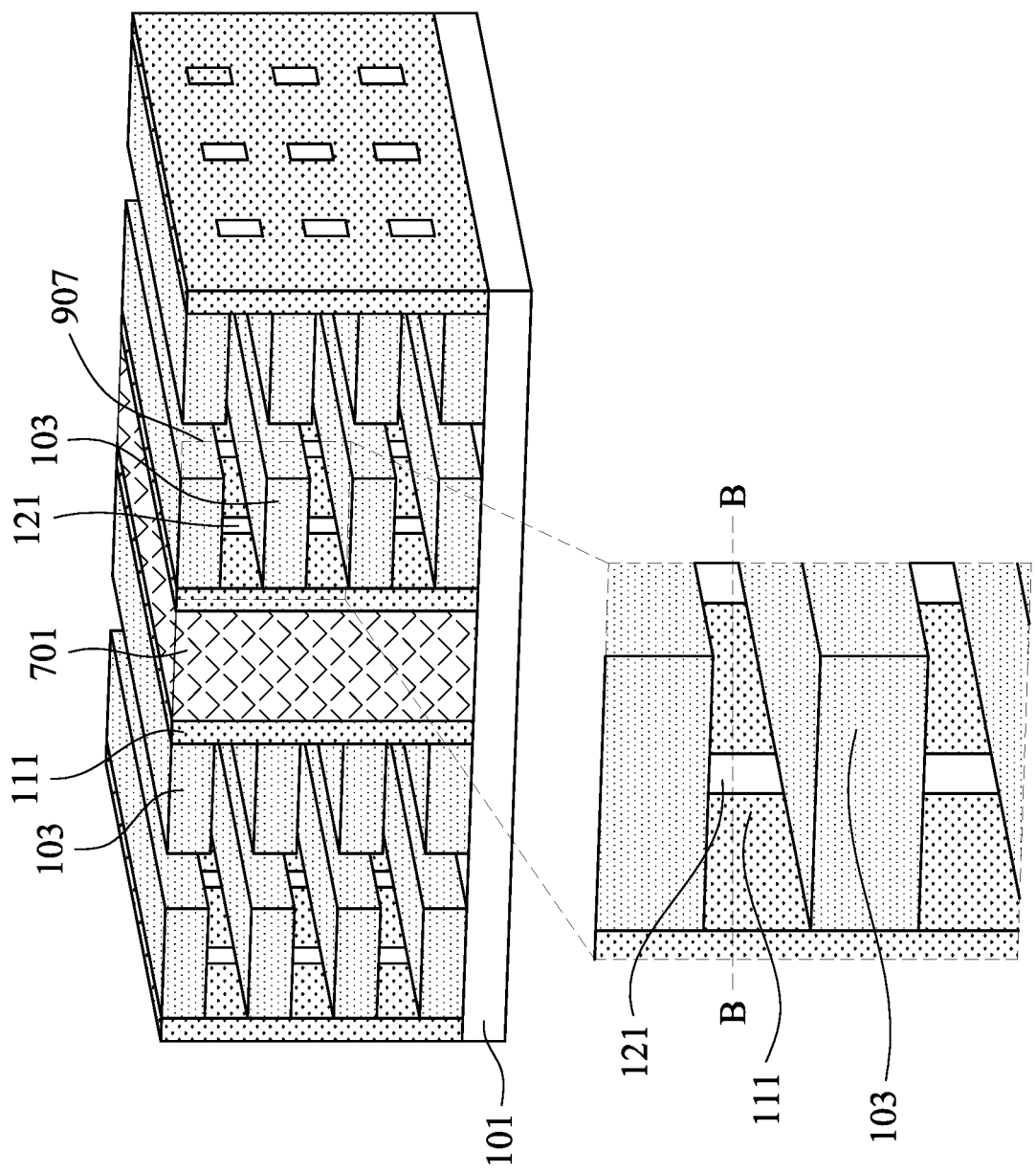

FIG. 9B further illustrates an area 907 of one of the openings 801. The area 907 is highlighted with a dashed line and the area 907 is also illustrated in a magnified view in FIG. 9C. As illustrated, sidewalls of the semiconductor channel regions 121 and the memory film 111 are exposed by the source/bit line gaps 901 in between the isolation layers 103. In FIGS. 9B through 9C, the dummy semiconductor layers 203 are etched in a timed process without substantively removing the material of the isolation layers 103 to form the source/bit line gaps 901 such that sidewalls of the semiconductor channel regions 121 and sidewalls of the memory film 111 are flush with each other.

Figures 9D, 9E:
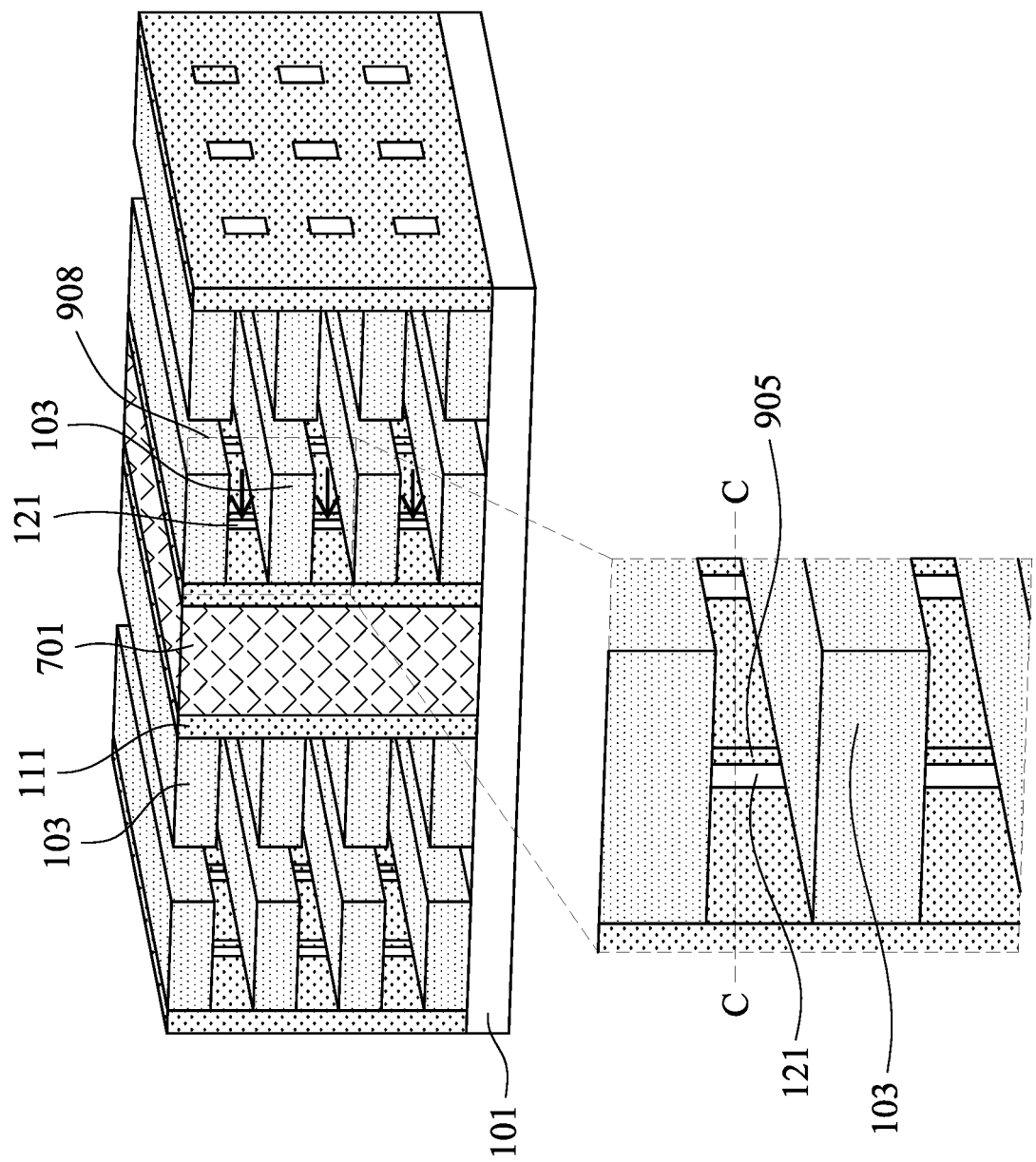

FIG. 9D further illustrates another embodiment that comprises an area 908 of one of the openings 801 after the formation of source/bit line gaps 901 in the multi-layer stack 201 (previously shown in FIG. 9A). The area 908 is highlighted with a dashed line and the area 908 is also illustrated in a magnified view in FIG. 9E. As illustrated, sidewalls of the semiconductor channel regions 121 and the memory film 111 are exposed by the source/bit line gaps 901 in between the isolation layers 103. A recess 905 in the semiconductor channel region 121 from the sidewall of the memory film 111 is also illustrated in the magnified view of the area 908 of FIG. 9E. According to some embodiments, the semiconductor channel regions 121 may be recessed from the sidewall of the memory film 111 during the forming of the source/bit line gaps 901 in a timed etch process that removes the dummy semiconductor layers 203 and further etches the semiconductor channel regions 121 in a lateral direction without substantively removing the material of the isolation layers 103.

Figure 10:
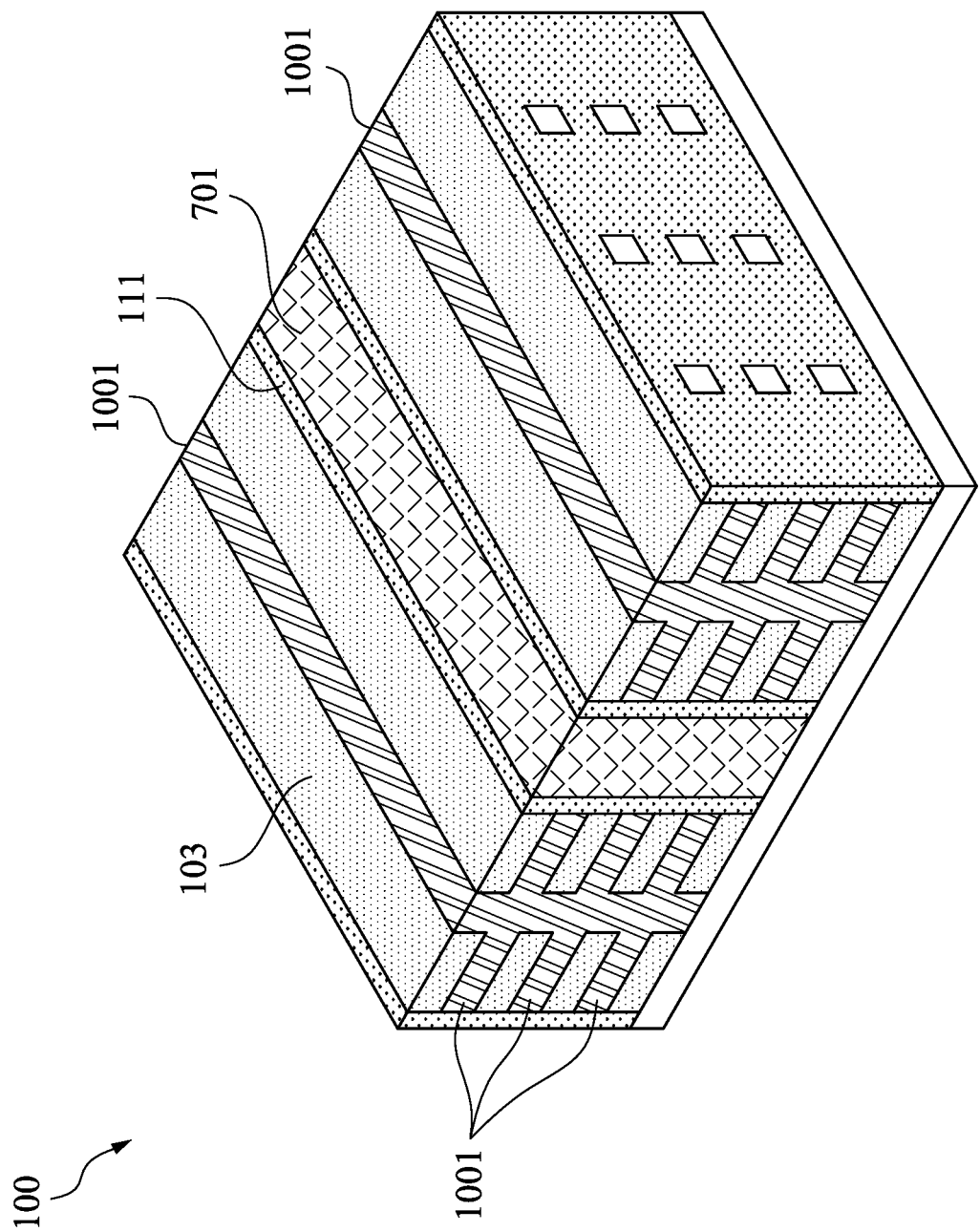

FIG. 10 illustrates the formation of a metal fill material 1001 in the openings 801 (see, e.g., FIG. 8) and the source/bit line gaps 901 (see, e.g., FIG. 9A through 9E). The metal fill material 1001 may comprise one or more layers, such as glue layers, barrier layers, diffusion layers, and fill layers, and the like and may be formed using any of the materials and processes suitable for forming the wrap-around word line structure 701. For example, the materials used to form the metal fill material 1001 may be the same as the materials used to form the wrap-around word line structure 701, although they may be different. In some embodiments, the metal fill material 1001 includes a glue layer and a conductive layer. The glue layer may be formed of a metal nitride suitable for forming the wrap-around word line structure 701 (e.g., titanium nitride, tantalum nitride, zirconium nitride, hafnium nitride, or the like). The conductive layer may be formed of a metal suitable for forming the wrap-around word line structure 701 (e.g., tungsten (W), titanium (Ti), titanium nitride (TiN), tantalum nitride (TaN), or the like). The material of the glue layer is one that has good adhesion to the material of the isolation layers 103 and/or the memory film 111 and the material of the conductive layer is one that has good adhesion to the material of the glue layer.

In some embodiments, the glue layer can be formed of titanium nitride (TiN) and the conductive layer can be formed of tungsten (W). The glue layer and conductive layer may each be formed by an acceptable deposition process such as atomic layer deposition, chemical vapor deposition, or the like. The materials of the metal fill material 1001 may be formed to fill and overfill the openings 801 and the source/bit line gaps 901 and may be formed over the top surfaces of the topmost layers of the isolation layers 103 outside of the openings 801. Once deposited, the materials of the metal fill material 1001 may be planarized with the topmost layers of the isolation layers 103, the memory film 111, and the wrap-around word line structure 701 using a process such as chemical mechanical planarization.

Figure 11:
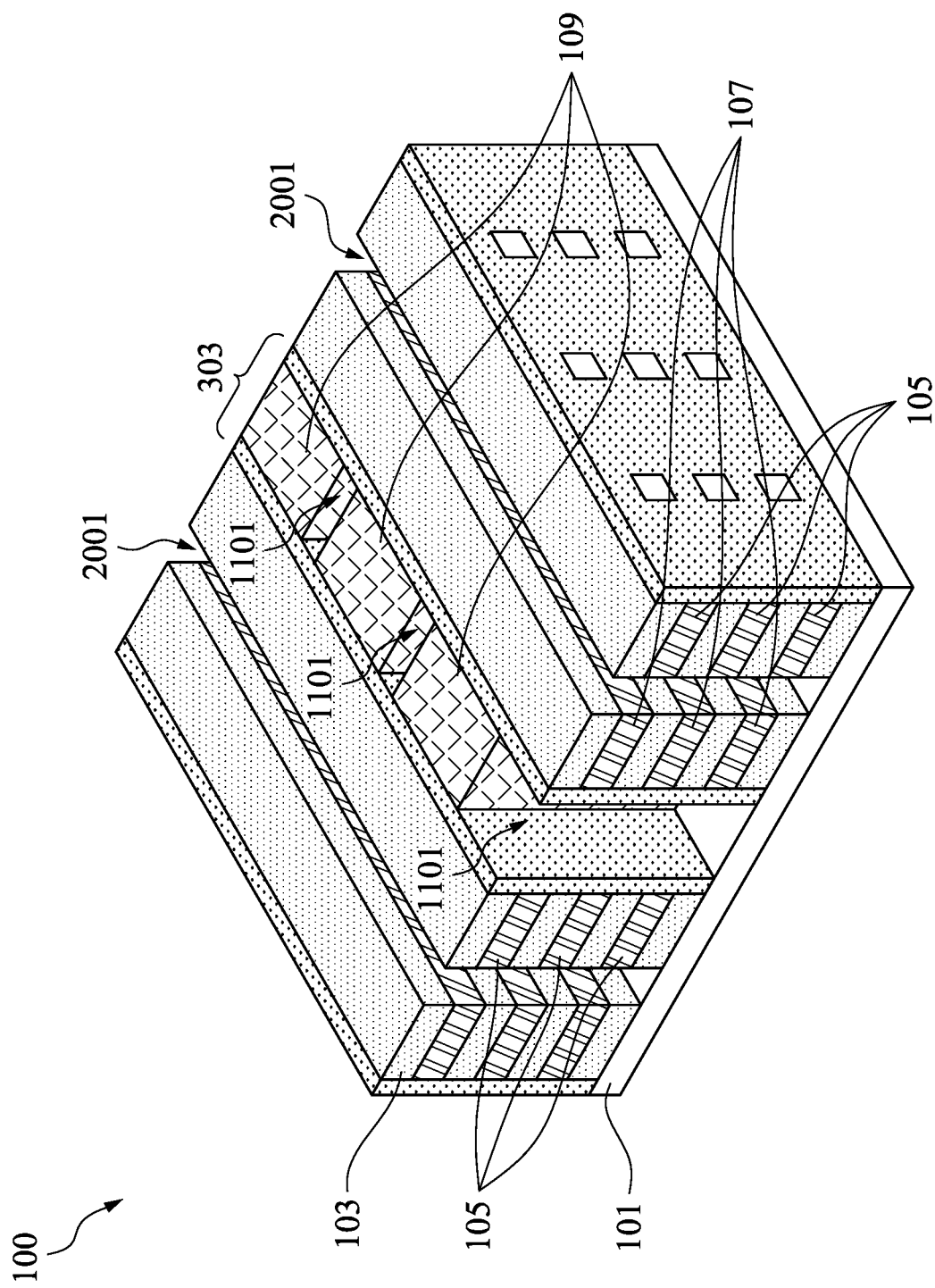

FIG. 11 illustrates the formation of word line gaps 1101 and removal of the metal fill material 1001 to form openings 2001 according to some embodiments. The word line gaps 1101 may be formed using any of the photolithography and etching techniques suitable for etching the materials of the wrap-around word line structure 701. The etching may be anisotropic. In some embodiments, the word line gaps 1101 and the openings 2001 can be formed by a series of appropriate etches (e.g., dry etches and/or wet etches). According to some embodiments, a dry etch is performed using a fluorine-based gas (e.g., $C_4F_6$) mixed with hydrogen ($H_2$) or oxygen ($O_2$) gas is used to remove the conductive layer of the wrap-around word line structure 701 and a wet etch is performed using a nitric acid ($HNO_3$) and hydrofluoric acid (HF) solution to remove the glue layer of the wrap-around word line structure 701. However, other suitable removal processes may be utilized to remove the materials from the word line gaps 1101 and the openings 2001. Forming the word line gaps 1101 divides the wrap-around word line structure 701 into the word lines 109, according to some embodiments.

FIG. 11 further illustrates that openings 2001 separate the bit lines 107 of the memory cell 125 from the source lines 105 of adjacent memory cells in another row of the memory array 100. In addition, openings 2001 separate the source lines 105 of the memory cell 125 from the bit lines 107 of adjacent memory cells in another row of the memory array 100. The openings 2001 may be filled with dielectric materials (described subsequently in FIG. 12A) to allow for the isolation of a source line 105 of the memory cell 125 from a bit line 107 of an adjacent memory cell that is formed in the same layer as the source line 105 to allow for minimal interference between the memory cell 125 and the adjacent memory cell when read and/or write operations are being performed in the memory cell 125 and the adjacent memory cell. In addition, the openings 2001 may be filled with dielectric materials (described subsequently in FIG. 12A) to allow for the isolation of a bit line 107 of the memory cell 125 from a source line 105 of an adjacent memory cell that is formed in the same layer as the bit line 107 to allow for minimal interference between the memory cell 125 and the adjacent memory cell when read and/or write operations are being performed in the memory cell 125 and the adjacent memory cell.

FIG. 12A illustrates the formation of the spacers 117, the gate isolation plugs 115, the source lines 105, the bit lines 107, and the word lines 109 according to some embodiments. In particular, FIG. 12A illustrates a portion of the 3D memory array 100 in a perspective view with the gate isolation plugs 115 and the array spacers 117 formed in the word line gaps 1101 and the openings 2001 of FIG. 11. The array spacers 117 and the gate isolation plugs 115 are formed of dielectric materials. Acceptable dielectric materials include, but are not limited to oxides such as silicon oxide; nitrides such as silicon nitride; carbides such as silicon carbide; the like; or combinations thereof such as silicon oxynitride, silicon oxycarbide, silicon carbonitride, or the like. In some embodiments, the array spacers 117 and the gate isolation plugs 115 are formed using the same materials and a same deposition process. The material of the gate isolation plugs 115 and the array spacers 117 may be formed by an acceptable deposition process such as ALD, CVD, flowable CVD (FCVD), or the like to fill and/or overfill the word line gaps 1101 and openings 2001, respectively.

In other embodiments, the materials used to form the gate isolation plugs 115 may be different from the materials used to form the array spacers 117. In such embodiments, separate removal processes may be used to form the openings 2001 and to form the word line gaps 1101. Furthermore, separate deposition processes may be used to form the gate isolation plugs 115 and the array spacers 117. Furthermore, the array spacers 117 may be formed before the gate isolation plugs 115, although the array spacers 117 may be formed after the gate isolation plugs 115. All such removal processes, deposition processes, and ordering of such processes are within the scope of the embodiments.

FIG. 12B through 12D illustrate cross-sectional views of the cut-line D-D of FIG. 12A after the formation of the array spacers 117, the gate isolation plugs 115, the source lines 105, the bit lines 107, and the word lines 109, in accordance with some varying embodiments. A tuning selectivity of the etching process (described earlier in FIG. 5) used to form the semiconductor channel regions 121 may be adjusted such that the semiconductor channel regions 121 are formed with smooth surfaces or comprising a plurality of faceted surfaces. As such, the semiconductor channel regions 121 may be formed with different profile shapes (e.g., round, square, rectangle, hexagon, octagon, or the like, as shown in FIGS. 12B through 12D). Since the memory film 111 is formed as a conformal thin film (described earlier in FIG. 6) on exposed surfaces of the semiconductor channel regions 121, the memory film will be formed with a similar profile shape (e.g., round, square, rectangle, hexagon, octagon, or the like) as the semiconductor channel regions 121.

In FIG. 12E, a cross-sectional view is illustrated along a line similar to B-B of FIG. 9C in accordance with some embodiments, after the formation of the array spacers 117, the gate isolation plugs 115, the source lines 105, the bit lines 107, and the word lines 109 (described above in FIG. 12A). FIG. 12E illustrates the semiconductor channel region 121 between the source line 105 and the bit line 107. FIG. 12E also illustrates the memory film 111 surrounding and being wrapped around the semiconductor channel region 121 and the word line 109 over and surrounding the memory film 111. The gate isolation plugs 115 isolate the word line 109 of a memory cell 125 from word lines 109 of adjacent memory cells. In FIG. 12E, the sidewalls of the semiconductor channel region 121 and the sidewalls of the memory film 111 are shown as flush with each other as a result of a timed etching process (described above in FIGS. 9A through 9C).

In FIG. 12F, a cross-sectional view is illustrated along a line similar to C-C of FIG. 9E in accordance with some embodiments, after the formation of the array spacers 117, the gate isolation plugs 115, the source lines 105, the bit lines 107, and the word lines 109 (described above in FIG. 12A). FIG. 12F illustrates the semiconductor channel region 121 between the source line 105 and the bit line 107. FIG. 12F also illustrates the memory film 111 surrounding and being wrapped around the semiconductor channel region 121 and the word line 109 over and surrounding the memory film 111. The gate isolation plugs 115 isolate the word line 109 of a memory cell 125 from word lines 109 of adjacent memory cells. FIG. 12F further illustrates the semiconductor channel region 121 as recessed from the sidewall of the memory film 111 as a result of a timed etch process (described earlier in FIGS. 9A, 9D, and 9E) that etches both ends of the semiconductor channel region 121 to a first depth D1 in a lateral direction. According to some embodiments, the first depth D1 may be in a range between about 5 nm to about 30 nm. However, any suitable depth may be used. The source line 105 and the bit line 107 extend into and fill the recesses 905 to contact the ends of the semiconductor channel region 121. Furthermore, a tuning selectivity of the etching process may be adjusted to shape the distal ends of the semiconductor channel region 121 to a desired shape (e.g., concave, convex, flat, round, comprising a plurality of facets, or the like). In the illustrated embodiment, the distal ends of the semiconductor channel region 121 are concave.

It has been observed that forming a 3-dimensional (3D) memory array wo that comprises a plurality of stacked memory cells 125 where each of the memory cells may include a gate-all-around (GAA) transistor, and that includes forming a metal-free multi-layer stack 201 comprising a dummy semiconductor layer 203 as a dummy source line and a dummy bit line in the same layer, and subsequently replacing the dummy semiconductor layer 203 by a conductive material to form a source line 105 and a bit line 107 of a memory cell 125 that is isolated from adjacent memory cells 125 may have some advantages. For example, forming a multi-layer stack 201 with one or more metal layers instead of the dummy semiconductor layers 203 may complicate a subsequent etching process used to pattern a gate structure and may result in an etching profile that is worse than would have been possible if the multi-layer stack 201 did not comprise the one or more metal layers. In addition, forming the source line 105 and bit line 107 corresponding to each memory cell 125 in different layers would lead to an increase in the height and the aspect ratio of the multi-layer stack 201, leading to a reduction in device density. Further, insufficient isolation between the source lines 105 and the bit lines 107 of the memory cell 125 and adjacent memory cells may result in interference between the memory cell 125 and the adjacent memory cells when read and/or write operations are being performed in the memory cell 125 and the adjacent memory cells.

FIG. 13A illustrates a portion of the 3D-NOR memory array 100, according to some embodiments. The memory array wo comprises a staircase contact structure 1313 formed within the second region 207 of the multi-layer stack 201 in accordance with some embodiments. The staircase contact structure 1313 may be formed by initially placing a photoresist 56 (shown in FIG. 13B) over the multi-layer stack 201 after the formation of the array spacers 117, the gate isolation plugs 115, the source lines 105, the bit lines 107, and the word lines 109 (described above in FIG. 12A). FIG. 13B through 13F illustrate a cross-sectional view of the second region 207 of the memory array 100 along the line E-E of FIG. 13A. The photoresist 56 can be formed by using a spin-on technique and can be patterned using acceptable photolithography techniques. Patterning the photoresist 56 may expose a portion of the multi-layer stack 201 in a first staircase region 1301 while masking remaining portions of the multi-layer stack 201 (shown in FIG. 13B).

Once the first staircase region 1301 has been exposed, the exposed portions of the multi-layer stack 201 in the first staircase region 1301 are etched in a staircase etching process using the photoresist 56 as a mask. The staircase etching process may be any acceptable etch process, such as by wet or dry etching, a reactive ion etch (RIE), neutral beam etch (NBE), the like, or a combination thereof. The etching may be anisotropic. The etching may remove portions of the topmost layers of the isolation layers 103, the topmost of the source lines 105, and the topmost of the bit lines 107 in the first staircase region 1301(shown in FIG. 13C) such that the isolation layer 103 underlying the topmost of the source lines 105 and the topmost of the bit lines 107 is exposed in the first staircase region 1301. Because the topmost layers of the isolation layers 103 and the topmost of the source lines 105 and the bit lines 107 have different material compositions, etchants used to remove exposed portions of these layers may be different. In some embodiments, the source lines 105 and the bit lines 107 act as etch stop layers while etching the overlying layer of the isolation layers 103. Once the topmost layers of the isolation layers 103 have been removed, the topmost layers of the source lines 105 and the topmost of the bit lines 107 are exposed in the first staircase region 1301. As such, the underlying isolation layers 103 act as etch stop layers while etching the overlying source lines 105 and the bit lines 107. As a result, the portions of the topmost layers of the isolation layers 103 and the topmost of the source lines 105 and the bit lines 107 may be selectively removed without removing remaining layers of the multi-layer stack 201, and the pattern of the photoresist 56 may be extended into the first staircase region 1301 of the multi-layer stack 201 to a desired depth. Alternatively, a timed etch processes may be used to stop the etching after reach a desired depth into first staircase region 1301 of the multi-layer stack 201. As such, the next layer of the isolation layers 103 underlying the topmost layer of the source lines 105 and the topmost of the bit lines 107 is exposed in the first staircase region 1301.

Once the next layer of the isolation layers 103 has been exposed, the photoresist 56 may be trimmed (shown in FIG. 13D) to expose another portion of the multi-layer stack 201 in a second staircase region 1303 while masking remaining portions of the multi-layer stack 201 outside of the first staircase region 1301 and the second staircase region 1303. Once the second staircase region 1303 has been exposed, the exposed portions of the multi-layer stack 201 in the first staircase region 1301 and second staircase region 1303 are etched (shown in FIG. 13D) by repeating the staircase etching process using the trimmed photoresist 56 as a mask. The etching may remove portions of the topmost layer of the isolation layers 103 and the topmost of the source lines 105 and the bit lines 107 exposed in the second staircase region 1303 and in the first staircase region 1301 such that the next layer down of the isolation layers 103 in the multi-layer stack 201 is exposed in each of the first staircase region 1301 and the second staircase region 1303.

Once the next layer down of the isolation layers 103 in the multi-layer stack 201 has been exposed in each of the first staircase region 1301 and the second staircase region 1303, the photoresist 56 may be trimmed again (shown in FIG. 13E) to expose yet another portion of the multi-layer stack 201 in a third staircase region 1305 while masking remaining portions of the multi-layer stack 201. The trimming of the photoresist 56 and the staircase etching process may be repeated until a desired number of staircase regions have been exposed. In the illustrated embodiment, three of the staircase regions are exposed with the last trimming of the photoresist 56 exposing the third staircase region 1305. However, more of fewer staircase regions may be formed. For example in a multi-layer stack 201 comprising a lesser number of source lines 105 or bit lines 107 (e.g., two), fewer staircase regions (e.g., two) may be formed. As another example in a multi-layer stack 201 comprising a greater number of source lines 105 or bit lines 107 (e.g., four, five, six, . . . etc.), more staircase regions (e.g., four, five, six, . . . etc.) may be formed.

Once the desired number (e.g., three) of the staircase regions have been exposed, staircase contact areas 1307 are exposed by using the trimmed photoresist 56 as a mask and etching the exposed portions of the isolation layers 103 (shown in FIG. 13F) in the staircase regions. The etching may remove portions of the topmost layers of the isolation layers 103 such that the next layer down of the metal fill material 1001 that forms the source lines 105 and the bit lines 107 in the multi-layer stack 201 are exposed in each of the first staircase region 1301, the second staircase region 1303, and the third staircase region 1305. These exposed portions of the metal fill material 1001 may serve as the staircase contact areas 1307.

Figure 13G:
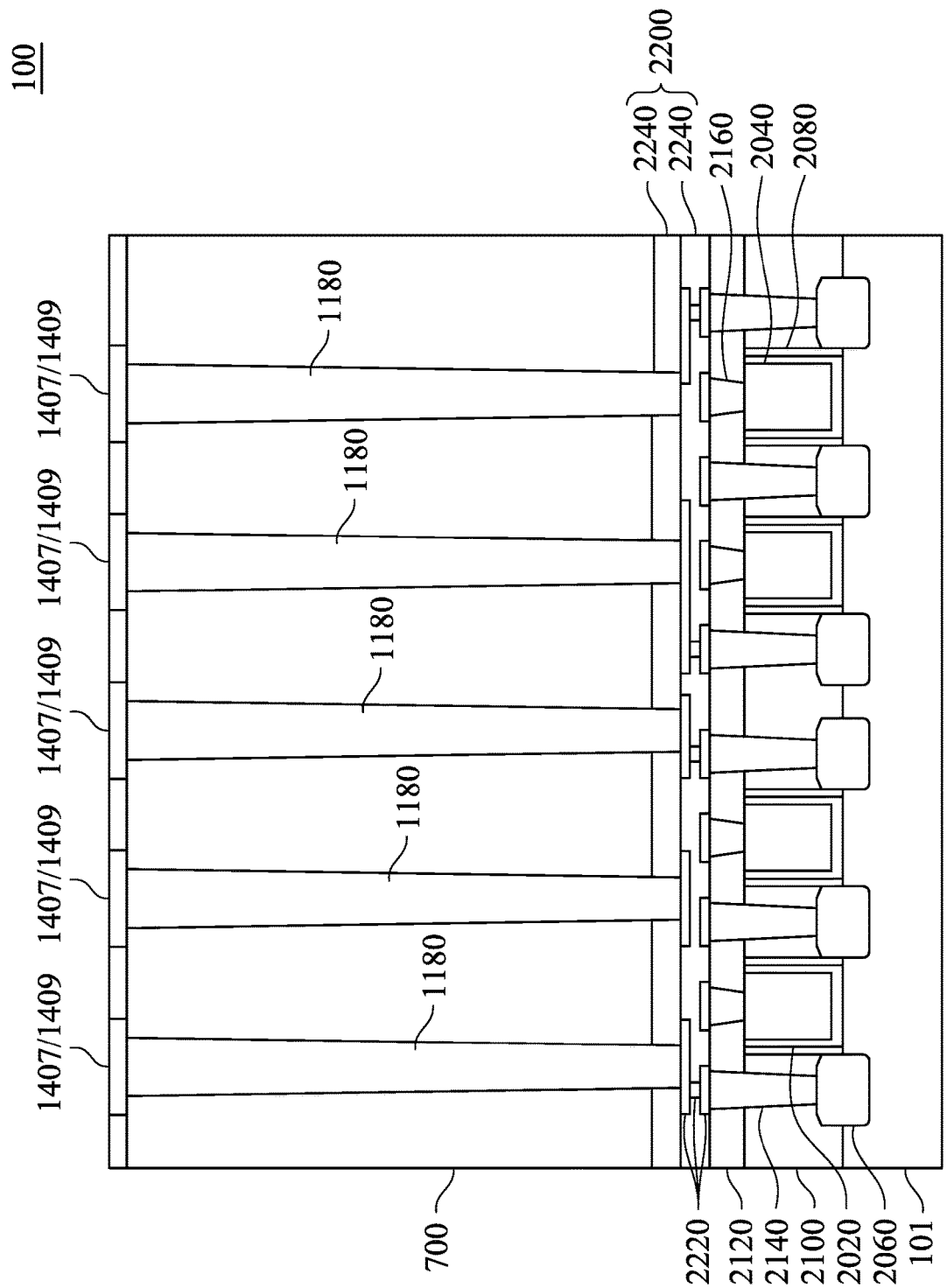

Further, FIGS. 13A through 13G illustrates a formation of conductive contacts 1309 over the staircase contact areas 1307 and the word lines 109, according to some embodiments. FIG. 13G illustrates a cross-sectional view of the memory array 100 and underlying substrate along the line F-F of FIG. 13A. The conductive contacts 1309, the staircase contact areas 1307 and isolation layers 103 may be collectively referred to as a staircase contact structure 1313. The staircase contact structures 1313 of adjacent memory cells 125 may be separated by a width that is equal to the first width W1 of the array spacers 117.

The conductive contacts 1309 may be electrically connected to the conductive source line structures 1407, the conductive bit line structures 1409, or the conductive word line structures 1405, which connect the memory array 100 to underlying active devices and/or signal, power, and ground lines in the semiconductor die. For example, conductive vias 1180 may extend through an intermetal dielectric (IMD) 700 to electrically connect conductive source line structures 1407 and the conductive bit line structures 1409 to the underlying circuitry of the interconnect structure 2200 and the active devices on the substrate 101. In alternate embodiments, routing and/or power lines to and from the memory array may be provided by an interconnect structure formed over the memory array 100 in addition to or in lieu of the interconnect structure 2200. Accordingly, the memory array 100 may be completed.

In an embodiment in which the conductive contacts 1309 are conductive pillars (e.g., tungsten, copper, aluminum, titanium, alloys, combinations, or the like), the conductive contacts 1309 may be formed by initially forming the IMD 700 over the first region 205 and the second region 207 of the multi-layer stack 201. Once formed, the IMD 700 is patterned using suitable photolithographic and etching processes to form openings through the interlayer dielectric layer and expose areas of the word lines 109 and/or the staircase contact areas 1307 in desired locations of the conductive contacts 1309. Once the openings have been formed, the openings may be filled and/or overfilled with a conductive fill material (e.g., W, Al, Cu, or the like) using a suitable deposition process (e.g., chemical vapor deposition (CVD), physical vapor deposition (PVD), or the like). Once deposited, a planarization process may be performed to planarize the top surfaces of the conductive contacts 1309 to be co-planar with a surface of the interlayer dielectric layer. Once the conductive contacts 1309 have been formed, the interlayer dielectric layer (not shown) may remain to allow for further processing of the first 3D-NOR memory array 100, according to some embodiments.

Although the embodiment of FIGS. 13A through 13G illustrate a particular pattern for the staircase contact structures 1313, other configurations are also possible. For example, in the illustrated embodiment, the source lines 105 and the bit lines 107 that are in a same row of the array are all aligned with each other and the staircase contact areas 1307 of the bit lines 107 are formed on a same side of the 3D memory array wo as the source lines 105. However, in other embodiments, the staircase contact areas 1307 of bit lines 107 may be formed on a side of the 3D memory array 100 opposite from the staircase contact areas 1307 of source lines 105. Furthermore, the word lines 109 of an adjacent memory cell may be aligned with the word lines 109 of the memory cell 125, although the word lines 109 of one memory cell 125 may also be offset from the word lines 109 of adjacent memory cells such that the word lines 109 and thus the conductive contacts 1309 connected to the word lines 109 have a staggered pattern from the memory cell 125 to an adjacent memory cell.

The embodiments of the present disclosure have some advantageous features. Forming a 3-dimensional (3D) memory array (e.g., a NOR memory array) that comprises a plurality of stacked memory cells and that includes forming a metal-free multi-layer stack comprising a dummy source line and a dummy bit line, and subsequently replacing the dummy source line and the dummy bit line by a conductive material to form a source line and a bit line may allow for the simplification of a subsequent etching process used to pattern a gate structure and allows for a better etching profile than would have been possible if the multi-layer structure comprised one or more metal layers. In addition, the source line and the bit line corresponding to each memory cell are formed in the same layer which allows for a reduction in the height and the aspect ratio of the metal-free multi-layer stack that is used in the fabrication process. The resulting memory array may also have a reduced height, increasing device density. Further, embodiments of the present disclosure allow for a source line of a first memory cell and a bit line of an adjacent second memory cell that are formed in the same layer to be isolated from each other such that there is minimal interference between the first memory cell and the second memory when read and/or write operations are being performed in the first memory cell and the second memory cell.

In accordance with an embodiment, a method includes forming a multi-layer stack including alternating layers of an isolation material and a semiconductor material; patterning the multi-layer stack to form a first channel structure in a first region of the multi-layer stack, where the first channel structure includes the semiconductor material; depositing a memory film layer over the first channel structure; etching a first trench extending through a second region of the multi-layer stack to form a first dummy bit line and a first dummy source line in the second region, where the first dummy bit line and first dummy source line each includes the semiconductor material; and replacing the semiconductor material of the first dummy bit line and the first dummy source line with a conductive material to form a first bit line and a first source line. In an embodiment, the forming the multi-layer stack includes depositing a dielectric material as the isolation material; and depositing an oxide semiconductor material as the semiconductor material. In an embodiment, the replacing the semiconductor material of the first dummy bit line and the first dummy source line includes etching the semiconductor material through the first trench. In an embodiment, etching the semiconductor material includes selectively etching the semiconductor material using a chlorine or fluorine based etchant. In an embodiment, the patterning the multi-layer stack to form the first channel structure includes selectively etching the isolation material in the first region of the multi-layer stack using an etch chemical that includes phosphorus. In an embodiment, the replacing the semiconductor material includes etching sidewalls of the first channel structure to define a recess. In an embodiment, the replacing the semiconductor material further includes filling the recess with the conductive material. In an embodiment, the method further includes forming a conductive structure around the memory film layer; etching an opening through the conductive structure in a location between the first channel structure and an adjacent second channel structure; and depositing a dielectric material in the opening.

In accordance with an embodiment, a method includes forming a multi-layer stack including alternating layers of a first material and a second material; forming trenches in a first region of the multi-layer stack, a strip being between adjacent trenches; etching the first material from the strip to form channel structures, where the channel structures include the second material; depositing a memory film layer over the channel structures; forming first openings in the multi-layer stack on opposite sides of the first region; etching the second material exposed along sidewalls of the first openings to form second openings connected to the first openings; and filling the first openings and the second openings connected to the first openings with a conductive material to form a first source line and a first bit line on a first side of the first region and a second source line and a second bit line on a second side of the first region opposite the first side. In an embodiment, the first source line, the first bit line, the second source line, and the second bit line are formed in the same layer. In an embodiment, a first memory cell of a memory array includes the first source line and the second bit line, a second memory cell of the memory array adjacent to the first memory cell includes the first bit line and a third memory cell of the memory array adjacent to the first memory cell includes the second source line. In an embodiment, the second material includes an oxide semiconductor film. In an embodiment, the etching the first material from the strip to form channel structures results in each of the channel structures having a profile shape that is round, square, rectangular, hexagonal, or octagonal. In an embodiment, the method further includes etching the conductive material to form third openings in the multi-layer stack; and filling the third openings with a dielectric material.

In accordance with an embodiment, a device includes a semiconductor substrate; a first memory cell over the semiconductor substrate, the first memory cell including a first channel region; a second memory cell over the first memory cell, the second memory cell including a second channel region over the first channel region; a memory film layer surrounding the first channel region and the second channel region; a wrap-around word line surrounding the memory film layer; a first source line on a first side of the first channel region; and a first bit line on a second side of the first channel region opposite the first side, where a sidewall of the first channel region facing the first bit line is offset from a sidewall of the memory film layer facing the first bit line. In an embodiment, the device further includes a stack of source lines and a stack of bit lines, where the stack of source lines includes the first source line, and where the stack of bit lines includes the first bit line. In an embodiment, the device further includes first isolation layers between adjacent source lines in the stack of source lines; and second isolation layers between adjacent bit lines in the stack of bit lines. In an embodiment, lengths of source lines in the stack of source lines increase in a direction towards the semiconductor substrate, and lengths of bit lines in the stack of bit lines increase in a direction towards the semiconductor substrate. In an embodiment, the first and the second channel regions includes an oxide semiconductor film. In an embodiment, each of the first and the second channel regions has a profile shape that is round, square, rectangular, hexagonal, or octagonal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a semiconductor substrate;
a first memory cell over the semiconductor substrate, the first memory cell comprising a first channel region;
a second memory cell over the first memory cell, the second memory cell comprising a second channel region over the first channel region;
a memory film layer surrounding the first channel region and the second channel region;
a wrap-around word line surrounding the memory film layer;
a stack of source lines on a first side of the first channel region, wherein a first portion of a first source line of the stack of source lines is in contact with the first channel region; and
a stack of bit lines on a second side of the first channel region opposite the first side, wherein a first portion of a first bit line of the stack of bit lines is in contact with the first channel region, wherein the first portion of the first source line has a larger width than other portions of the first source line, and wherein the first portion of the first bit line has a larger width than other portions of the first bit line.

2. The device of claim 1 further comprising:
first isolation layers between adjacent source lines in the stack of source lines; and
second isolation layers between adjacent bit lines in the stack of bit lines.

3. The device of claim 2, wherein lengths of source lines in the stack of source lines increase in a direction towards the semiconductor substrate, and lengths of bit lines in the stack of bit lines increase in a direction towards the semiconductor substrate.

4. The device of claim 1, wherein the first and the second channel regions comprise an oxide semiconductor film.

5. The device of claim 1, wherein each of the first and the second channel regions has a profile shape that is round, square, rectangular, hexagonal, or octagonal.

6. The device of claim 1, wherein the stack of source lines and the stack of bit lines comprise a metal.

7. A device comprising:
a first source line extending in a first direction;
a first bit line extending in the first direction;
a first channel region of a first memory cell disposed between and in physical contact with the first source line and the first bit line;
a second channel region of a second memory cell disposed between and in physical contact with the first source line and the first bit line, wherein the first memory cell is adjacent to the second memory cell, and each of the first channel region and the second channel region comprises a thin-film oxide semiconductor material;
a first wrap-around word line surrounding the first channel region, wherein the first wrap-around word line, the first source line, and the first bit line comprise a first material, and wherein the first material is a metal;
a second wrap-around word line surrounding the second channel region; and
a gate isolation plug disposed between the first wrap-around word line and the second wrap-around word line, wherein the gate isolation plug electrically isolates the first wrap-around word line from the second wrap-around word line.

8. The device of claim 7, wherein the thin-film oxide semiconductor material comprises zinc or indium.

9. The device of claim 7, further comprising:
a memory film layer disposed between the first channel region and the first wrap-around word line, and between the second channel region and the second wrap-around word line, wherein the memory film layer wraps around a first portion of the first source line, and wherein the memory film layer wraps around a first portion of the first bit line.

10. The device of claim 9, wherein the memory film layer comprises a oxide-nitride-oxide (ONO) or nitride-oxide-nitride (NON) multilayer dielectric.

11. The device of claim 9, wherein the memory film layer comprises a ferro-electric material.

12. The device of claim 7, further comprising:
a first spacer disposed between the first source line and a second bit line of a third memory cell; and
a second spacer disposed between the first bit line and a second source line of a fourth memory cell.

13. The device of claim 12, wherein a material of the gate isolation plug and a material of the first spacer are the same.

14. The device of claim 7, wherein distal ends of the first channel region are concave.

15. A device comprising:
a semiconductor substrate; and
a first memory cell and a second memory cell over the semiconductor substrate, wherein the first memory cell is adjacent to the second memory cell, the first memory cell comprising:
a first portion of a first source line, the first source line extending in a first direction;
a first portion of a first bit line, the first bit line extending in the first direction;
a first semiconductor channel region disposed between the first portion of the first source line and the first portion of the first bit line;
a first portion of a first word line surrounding the first semiconductor channel region; and
a first portion of a memory film layer disposed between the first portion of the first word line and the first semiconductor channel region, between the first portion of the first word line and the first portion of the first source line, and between the first portion of the first word line and the first portion of the first bit line, wherein a width of the first portion of the memory film layer is larger than a width of the first semiconductor channel region.

16. The device of claim 15, wherein the second memory cell comprises:
a second portion of the first source line;
a second portion of the first bit line;
a second semiconductor channel region disposed between the second portion of the first source line and the second portion of the first bit line; and
a first portion of a second word line surrounding the second semiconductor channel region, wherein the first word line and the second word line are isolated from each other by an isolation plug.

17. The device of claim 15, further comprising a third memory cell over the first memory cell, wherein the third memory cell comprises:
a first portion of a second source line;
a first portion of a second bit line;
a third semiconductor channel region disposed between the first portion of the second source line and the first portion of the second bit line; and
a second portion of the first word line surrounding the third semiconductor channel region.

18. The device of claim 15, wherein a sidewall of the first semiconductor channel region facing the first bit line is offset from a sidewall of the memory film layer facing the first bit line by a first distance.

19. The device of claim 18, wherein the first distance is in a range from 5 nm to 30 nm.

20. The device of claim 15, wherein the first semiconductor channel region has a profile shape that is hexagonal, or octagonal.

* * * * *